(12) United States Patent
Eichler et al.

(10) Patent No.: US 8,916,849 B2
(45) Date of Patent: Dec. 23, 2014

(54) OPTOELECTRONIC SEMICONDUCTOR CHIP

(75) Inventors: Christoph Eichler, Tegernheim (DE); Teresa Lermer, Regensburg (DE); Adrian Stefan Avramescu, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 87 days.

(21) Appl. No.: 13/579,259

(22) PCT Filed: Feb. 23, 2011

(86) PCT No.: PCT/EP2011/052681
§ 371 (c)(1),
(2), (4) Date: Oct. 22, 2012

(87) PCT Pub. No.: WO2011/104274
PCT Pub. Date: Sep. 1, 2011

(65) Prior Publication Data
US 2013/0039376 A1 Feb. 14, 2013

(30) Foreign Application Priority Data
Feb. 26, 2010 (DE) .......................... 10 2010 009 457

(51) Int. Cl.
| | | |
|---|---|---|
| *H01L 29/06* | (2006.01) | |
| *H01S 5/20* | (2006.01) | |
| *B82Y 20/00* | (2011.01) | |
| *H01L 31/00* | (2006.01) | |
| *H01S 5/065* | (2006.01) | |
| *H01S 5/343* | (2006.01) | |

(52) U.S. Cl.
CPC .............. *H01S 5/2018* (2013.01); *B82Y 20/00* (2013.01); *H01S 5/0655* (2013.01); *H01S 5/2009* (2013.01); *H01S 5/2027* (2013.01); *H01S 5/34333* (2013.01); *H01S 2301/18* (2013.01)
USPC .................. 257/12; 257/14; 257/15; 257/90; 257/189; 257/33.045; 372/64; 372/45.01

(58) Field of Classification Search
CPC ... H01S 5/3433; H01S 5/2009; H01S 5/0655; H01S 5/2018; H01S 5/22; H01S 5/3216; H01S 5/34333; B82Y 20/00
USPC ..................... 257/13, 79, 103, 183, 189, 414, 257/E33.023, E33.049, E33.044, E33.045, 257/E33.048, E33.054, E49.001, 12, 14, 257/15; 372/64, 45.01
See application file for complete search history.

(56) References Cited

U.S. PATENT DOCUMENTS

| | | |
|---|---|---|
| 6,493,367 B1 | 12/2002 | Ito et al. |
| 7,058,105 B2 | 6/2006 | Lee et al. |

(Continued)

FOREIGN PATENT DOCUMENTS

| | | |
|---|---|---|
| CN | 1490910 A | 4/2004 |
| EP | 1 411 559 A2 | 4/2004 |

(Continued)

OTHER PUBLICATIONS

Kelchner et al. Nonpolar AlGaN-Cladding-Free Blue Laser Diodes with InGaN Waveguiding. Applied Physics Express 2 (2009) 071003.*

(Continued)

*Primary Examiner* — Lynne Gurley
*Assistant Examiner* — Galina Yushina
(74) *Attorney, Agent, or Firm* — Slater & Matsil, L.L.P.

(57) ABSTRACT

An optoelectronic semiconductor chip, the latter includes a carrier and a semiconductor layer sequence grown on the carrier. The semiconductor layer sequence is based on a nitride-compound semiconductor material and contains at least one active zone for generating electromagnetic radiation and at least one waveguide layer, which indirectly or directly adjoins the active zone. A waveguide being formed. In addition, the semiconductor layer sequence includes a p-cladding layer adjoining the waveguide layer on a p-doped side and/or an n-cladding layer on an n-doped side of the active zone. The waveguide layer indirectly or directly adjoins the cladding layer. An effective refractive index of a mode guided in the waveguide is in this case greater than a refractive index of the carrier.

15 Claims, 25 Drawing Sheets

(56) References Cited

U.S. PATENT DOCUMENTS

| | | | |
|---|---|---|---|
| 2001/0038656 A1 | 11/2001 | Takeuchi et al. | |
| 2002/0039374 A1* | 4/2002 | Onomura et al. | 372/46 |
| 2003/0147440 A1 | 8/2003 | Nomura et al. | |
| 2005/0226295 A1 | 10/2005 | Taneya et al. | |
| 2007/0183469 A1* | 8/2007 | Ryu | 372/43.01 |

FOREIGN PATENT DOCUMENTS

| | | | | |
|---|---|---|---|---|
| JP | 2000-277862 A | | 10/2000 | |
| JP | 2008103772 | * | 5/2008 | H01S 5/323 |

OTHER PUBLICATIONS

Sze, Semiconductor Devices Physics and Technology, 2nd Edition, pp. 303-306.*

Sandford et al. Refractive index and birefringence of InGaN films grown by MOSCVD. Phys. Stat. Sol. (c) 2, No. 7, 2005, pp. 2783-2786.*

Tisch et al. Dependence of the refractive index of AlGaN on temperature and composition at elevated temperature. Journal of Applied Physics, 89, 2676-2685, (2001).*

Skierbiszewski et al. High power blue-violet InGaN laser diodes grown on bulk GaN substrates by plasma-assited molecular beam epitaxy. Semicond. Sci. Technol. 20, 2005, ppl 809-813.*

Laino et al. Study of substrate modes in a (AlIn)GaN/SiC semiconductor laser using finite element approach. Proceedings of the 5th International Conference Numerical Simulation of Optoelectronic Devices, 2005, pp. 33-34.*

Liu Lecture 4: Optical waveguides, pp. 1-99.*

Buda, M., et al., "Waveguiding in InGaN/GaN/AlGaN blue laser structures," IEEE Conference on Optoelectronic AMD Micorelectronic Materials and Devices, Dec. 6, 2000, pp. 438-442.

Jin, X., et al., "Mode Pattern Analysis of Gallium Nitride-based Laser Diodes," International Symposium on Photoelectronic Detection and Imaging 2009: Laser Sensing and Imaging, vol. 7382, Jun. 17, 2009, pp. 738200-1 through 738200-12.

Kelchner, K., et al., "Nonpolar AlGaNCladding-Free Blue Laser Diodes with InGaN Waveguiding," The Japan Society of Applied Physics, Applied Physics Express 2, 2009, pp. 071003-1 through 071003-3.

* cited by examiner (Prior Art)

(Prior Art)

A)

B)

A)

B)

A)

B)

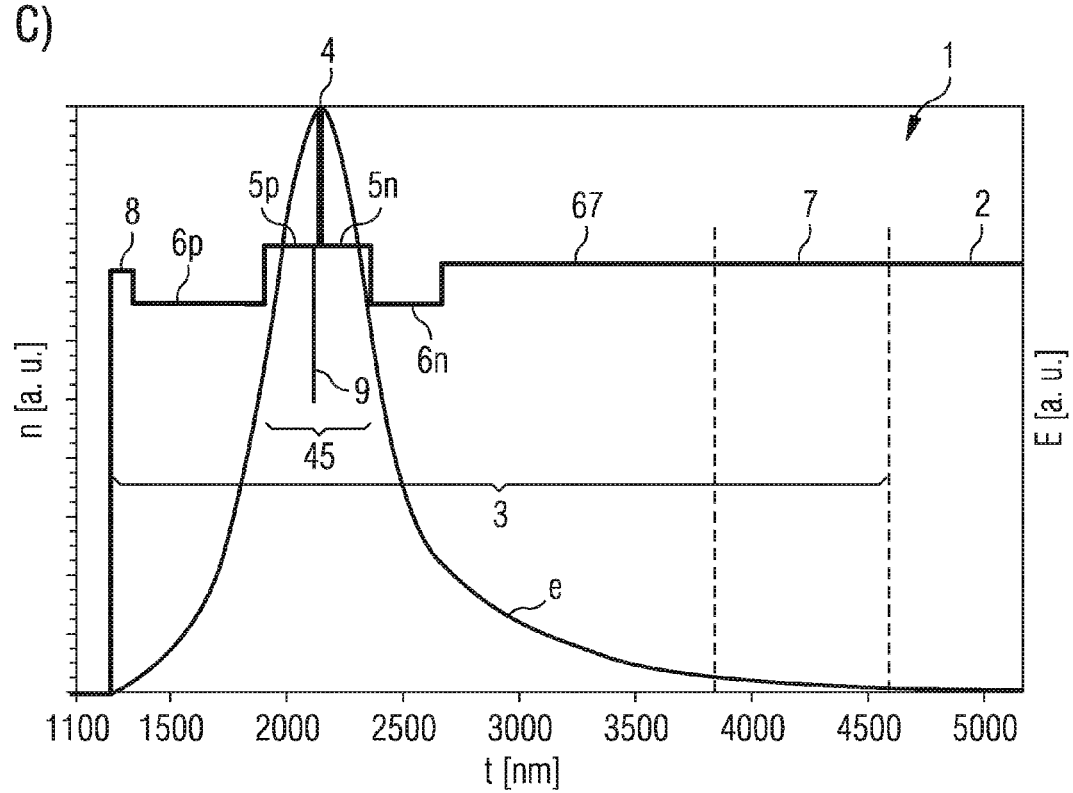

| | K(L1) | d(L1) | K(L2) | d(L2) | K(L3) | d(L3) | K(L4) | d(L4) | $K_a$(H1) | $K_a$(H2) |
|---|---|---|---|---|---|---|---|---|---|---|
| 1 | 8% | 400nm | 5% | 1600nm | | | | | 6,2% | 5% |
| 2 | 7% | 400nm | 4,5% | 1600nm | | | | | 5,5% | 4,5% |
| 3 | 6% | 400nm | 4% | 1600nm | | | | | 4,8% | 4% |
| 4 | 6% | 400nm | 2% | 1600nm | | | | | 3,6% | 2% |
| 5 | 5% | 100nm | 4% | 200nm | 3% | 300nm | | | 3% | 2% |
| 6 | 2% | 50nm | 5% | 100nm | 4% | 300nm | 2% | 1400nm | 2,9% | 2% |
| 7 | 1% | 50nm | 8% | 400nm | 4% | 1550nm | 2% | 1550nm | 5,5% | 4% |
| 8 | 8% | 100nm | 6% | 300nm | 4% | 1600nm | | | 5% | 4% |
| 9 | 8%→5% | 600nm | 5% | 1400nm | | | | | 5,9% | 5% |
| 10 | 5%→8% | 600nm | 5% | 1400nm | | | | | 5,9% | 5% |

OPTOELECTRONIC SEMICONDUCTOR CHIP

This patent application is a national phase filing under section 371 of PCT/EP2011/052681, filed Feb. 23, 2011, which claims the priority of German patent application 10 2010 009 457.9, filed Feb. 26, 2010, each of which is incorporated herein by reference in its entirety.

TECHNICAL FIELD

An optoelectronic semiconductor chip is provided.

SUMMARY OF THE INVENTION

In one aspect, the present invention provides an optoelectronic semiconductor chip in which a carrier of a semiconductor layer sequence does not act as a parasitic waveguide.

According to at least one embodiment of the optoelectronic semiconductor chip, the latter comprises a carrier and a semiconductor layer sequence mounted on the carrier. The carrier may in particular be a growth substrate on which the semiconductor layer sequence is grown epitaxially.

According to at least one embodiment of the optoelectronic semiconductor chip, the semiconductor layer sequence is based on a nitride compound semiconductor material. In the present context this means that the semiconductor layer sequence or at least part thereof, particularly preferably at least one active zone and/or one growth substrate such as the carrier comprises a nitride compound semiconductor material, preferably $Al_nGa_mIn_{1-n-m}N$ or consists thereof, wherein $0 \leq n \leq 1$, $0 \leq m \leq 1$ and $n+m \leq 1$. This material need not necessarily exhibit a mathematically exact composition according to the above formula. Instead, it may for example comprise one or more dopants and additional constituents. For simplicity's sake, however, the above formula includes only the fundamental constituents of the crystal lattice, i.e., Al, Ga, In, N, even if these may in part be replaced and/or supplemented by small quantities of further substances.

According to at least one embodiment of the semiconductor chip, the semiconductor layer sequence comprises an active zone, which is provided to generate electromagnetic radiation. The active zone preferably comprises at least one pn-junction or between one and ten quantum films inclusive, particularly preferably between one and five quantum films inclusive or between one and three quantum films inclusive. The term quantum films includes in particular quantum well structures irrespective of the dimensionality of the quantisation. The quantum films preferably contain InGaN. The wavelength of the radiation generated in operation is in particular in the ultraviolet or in the visible spectral range, for example between 340 nm and 600 nm inclusive, in particular between 390 nm and 540 nm inclusive. The electromagnetic radiation generated in the active zone is preferably coherent radiation, i.e., laser radiation. In other words, the semiconductor chip may be a laser diode chip. The active zone is thus a region in which optical amplification occurs. An imaginary part of the refractive index of the active zone may be less than zero.

According to at least one embodiment of the semiconductor chip, the average indium content of the active zone is between 0.5% and 15% inclusive. This in particular takes account of all indium-containing layers of up to 300 nm arranged symmetrically around a centrally located, light-generating region of the active zone.

According to at least one embodiment of the semiconductor chip, barrier layers, preferably based on InGaN, are located at least between two of the adjacent quantum films, in particular between all the adjacent quantum films. These barrier layers have in particular an indium content of between 0.01% and 20% inclusive, preferably of between 0.01% and 10% inclusive. Layer thicknesses of the barrier layers between the quantum films of the active zone 4 are in particular between 0.1 nm and 30 nm inclusive, preferably between 0.1 nm and 15 nm inclusive, particularly preferably between 1 nm and 10 nm inclusive.

According to at least one embodiment of the optoelectronic semiconductor chip, the semiconductor layer sequence comprises at least one waveguide layer. Preferably, the semiconductor layer sequence contains two waveguide layers, between which is located the active zone. The waveguide layers are in particular those layers which indirectly or directly adjoin the active zone and which have a refractive index which is greater than or equal to the refractive index of the carrier.

According to at least one embodiment of the semiconductor chip, a waveguide in which an optical mode is guided is formed by the at least one waveguide layer and by the active zone. The waveguide may be a two-dimensional or a one-dimensional waveguide. In the case of a two-dimensional waveguide, the radiation generated in the active zone is guided in a plane, in the case of one-dimensional waveguide along a line. The guided mode preferably comprises a fundamental mode, for example the "$TEM_{00}$" mode. The waveguide is preferably configured such that, when the semiconductor chip is operating properly, only the fundamental mode is guided in the waveguide.

According to at least one embodiment of the semiconductor chip, the waveguide layer or two of the waveguide layers is/are adjoined by cladding layers. The cladding layers are each located on a side of the waveguide layer or the waveguide layers remote from the active zone. The cladding layer may be p-doped or n-doped. Cladding layers are in particular those layers which indirectly or directly adjoin the waveguide layers, the refractive index of the cladding layers being lower than the refractive index of the carrier and thus also lower than the refractive index of the waveguide layers.

According to at least one embodiment of the semiconductor chip, the cladding layers start in the semiconductor layer sequence, viewed in a direction away from a geometric centre of the active zone, at the point where an aluminium content is for the first time greater than zero or greater than 0.01% or greater than 0.1% or greater than 1%. If barrier layers are accommodated within the waveguide, these barrier layers, which typically have a thickness of at most 50 nm, are preferably not included in the determination of the start of the cladding layers. For example the start of the cladding layers, in the direction away from the centre of the active zone, is a sub-region of the semiconductor layer sequence with a thickness of at least 100 nm and a continuous, non-vanishing aluminium content. The cladding layer may also start at a superlattice, which is formed for example by alternate layers comprising AlGaN/GaN or AlGaN/AlGaN or AlInGaN/GaN, individual layers of the superlattice having a thickness of preferably at most 20 nm or at most 10 nm or at most 5 nm and the superlattice in particular having a thickness of at least 100 nm or at least 200 nm.

According to at least one embodiment of the semiconductor chip, an effective refractive index of the mode guided in the waveguide is greater than a refractive index of the carrier. In particular, the effective refractive index amounts to at most 1.05 times the refractive index of the carrier.

The effective refractive index is in this case a number which quantifies a phase delay per unit length in the waveguide, relative to a phase delay under a vacuum. The effective refractive index is dependent on the guided mode.

Thus, as a rule an effective refractive index of the fundamental mode differs from an effective refractive index of a higher mode, even at the same wavelength. Furthermore, the effective refractive index is dependent on a propagation constant $\beta$. The propagation constant is given by the following relationship:

$$\vec{E}(x,y,z,t) = \vec{E}_0(x,y) e^{i(\beta z - \omega t)}.$$

$\vec{E}$ is here electrical field strength, z is a propagation direction or guidance direction in the waveguide, $\omega$ is radiation frequency and t is time. The propagation constant is likewise dependent on the guided mode and thus differs, for instance, for the fundamental mode and for higher modes. The propagation constant may be determined by programs for optics simulation or may also be determined experimentally for example by interferometry. The propagation constant thus indicates a phase change for light propagating in a medium and in particular in a waveguide relative to a unit length.

The following relationship then applies for the effective refractive index $n_{eff}$:

$$n_{eff} = \frac{\beta \lambda}{2\pi}.$$

For the effective refractive index $n_{eff}$ of a guided mode in a waveguide, it is preferably the case that the effective refractive index is lower than the refractive index or the average refractive index of the waveguide and that the effective refractive index is greater than or equal to the refractive index or average refractive index of the cladding layer. In other words, the effective refractive index for a guided mode lies between the refractive index of the cladding layer and the refractive index or the average refractive index of the waveguide. If this condition is not met, the mode is as a rule not guided or optical losses arise on guidance of the mode.

In at least one embodiment of the optoelectronic semiconductor chip, the latter comprises a carrier and a semiconductor layer sequence mounted, in particular grown, on the carrier. The semiconductor layer sequence is based on a nitride-compound semiconductor material and contains at least one active zone for generating electromagnetic radiation and at least one waveguide layer, which indirectly or directly adjoins the active zone, a waveguide being formed. In addition, the semiconductor layer sequence comprises a p-cladding layer adjoining the waveguide layer on a p-doped side and/or an n-cladding layer on an n-doped side of the active zone. The waveguide layer indirectly or directly adjoins the cladding layer. An effective refractive index of a mode guided in the waveguide is in this case greater than a refractive index of the carrier.

The insight underlying the stated semiconductor chip is thus in particular that of applying a combination of layers of low refractive index and of high refractive index to the carrier, in particular a growth substrate, in precisely such a way that a waveguide is formed in which a mode is guided, an effective refractive index for the guided mode being greater than the refractive index of the carrier. In the case of the described semiconductor chip it is not necessary for an evanescent field, which arises on total reflection at the boundary surface in particular between waveguide and cladding layer and extends into the cladding layer, to be prevented from penetrating into the in particular transparent carrier. The evanescent field may thus penetrate into the carrier. For example, the evanescent field in the carrier has in places a comparatively high amplitude of at least $1/e^3$ or of at least 5% or of at least 2.5%, relative to an output amplitude of the field at a boundary surface at which total reflection takes place. With conventional laser chips, this penetration of the evanescent field into the carrier is generally stopped, in particular by particularly thick cladding layers. However, since according to the stated semiconductor chip the refractive index of the carrier is lower than the effective refractive index of the guided mode, no parasitic mode is able to form in the carrier, although the evanescent field may penetrate into the carrier.

A parasitic mode in the carrier is in particular manifested as an additional band in an optical far field, for example at around 20°. Such bands occur in particular at the side of the active zone facing the carrier. Said additional bands impair the beam quality of the semiconductor chip preferably embodied as a laser. This has a disruptive effect for example in data storage applications and in projection applications. Because a mode is prevented from becoming established in the carrier, this problem is avoidable.

According to at least one embodiment of the semiconductor chip, the n-cladding layer is based on AlGaN with an Al-content of between 0.1% and 20% inclusive or on AlInN or AlInGaN. In particular the n-cladding layer consists of or is based on $Al_xGa_{1-x}N$ with $0.0001 \leq x \leq 0.30$, on $Al_xIn_{1-x}N$ with $0.74 \leq x \leq 0.90$ or on $(Al_{1-y}In_y)_xGa_{1-x}N$ with $0.74 \leq y \leq 0.90$ and $0.01 \leq x \leq 0.3$.

According to at least one embodiment of the semiconductor chip, an electron barrier layer is arranged between the p-cladding layer and the waveguide and/or a hole barrier layer is arranged between the n-cladding layer and the waveguide. Such barrier layers may also be arranged within the waveguide.

According to at least one embodiment of the semiconductor chip, in order to improve wave guidance between at least two of the adjacent quantum films, the waveguide contains a barrier layer based on InGaN with an In content of between 0.1% and 20% inclusive and a thickness of between 0.1 nm and 30 nm inclusive. Due to the barrier layers between the quantum films it is possible to form a superlattice.

According to at least one embodiment of the semiconductor chip, the waveguide layer comprises a superlattice with layers with alternately high and low refractive indices, the thicknesses of the layers amounting in each case to between 0.1 nm and 70 nm inclusive or between 1 nm and 50 nm inclusive. The layers are based for example on GaN or on InGaN with an In content of up to 25%.

According to at least one embodiment of the semiconductor chip, the cladding layer comprises a superlattice with layers with alternately high and low refractive indices, the thicknesses of the layers amounting in each case to between 0.1 nm and 70 nm inclusive. In the case of a p-cladding layer, the thicknesses of the layers are preferably between 1 nm and 70 nm inclusive. The layers are based for example on GaN or on AlGaN with an Al content of up to 25%.

According to at least one embodiment of the optoelectronic semiconductor chip, the waveguide layer or at least one of the waveguide layers and/or the cladding layer or at least one of the cladding layers is formed with a graded refractive index profile. In other words, the refractive index is not constant within the corresponding layer, but rather is purposefully varied. In particular, the refractive index of the corresponding layers declines monotonically, in a direction away from the active zone.

According to at least one embodiment of the optoelectronic semiconductor chip, at least one of the cladding layers, preferably the cladding layer closest to the carrier, is subdivided into at least two sub-layers. Between adjacent sub-layers there is located in particular a material with a refractive index which corresponds roughly to the refractive index of the carrier. The cladding layer is preferably subdivided into 2 to 10 sub-layers, which may exhibit a thickness which increases monotonically in a direction away from the active zone.

According to at least one embodiment of the semiconductor chip, at least one of the cladding layers, i.e., the n-cladding layer and/or the p-cladding layer, exhibits a stepped or ramp-shaped aluminium content profile along a direction of growth of the semiconductor layer sequence and/or in a direction perpendicular to the carrier. Stepped means that the aluminium content is constant or approximately constant within a step. Ramp-shaped means that the aluminium content changes in a linear or approximately linear manner along the direction of growth and/or in the direction perpendicular to the carrier. For example the cladding layer comprises 2, 3, 4, 5 or 6 or up to 15 steps and/or ramps. The difference in the aluminium content of adjacent steps is in particular between 0.01 percentage points and 20 percentage points inclusive or between 0.5 percentage points and 10 percentage points inclusive or between 1 percentage point and 5 percentage points inclusive.

It is in this case particularly preferable for the average aluminium content of a first half of the cladding layer to be greater than the average aluminium content in a second half of the cladding layer. The first and second halves exhibit the same geometric thickness. The two halves may constitute a merely notional subdivision of the cladding layer into two sub-regions of equal thickness. The first half is here closer to the waveguide with the active zone than the second half.

According to at least one embodiment of the semiconductor chip, the average aluminium content of the first half exceeds that of the second half by at least 0.01 percentage points or by at least 0.1 percentage points or by at least 0.5 percentage points. Preferably, the difference in the average aluminium content amounts to at most 15 percentage points or at most 10 percentage points or at most 5 percentage points.

According to at least one embodiment of the semiconductor chip, the aluminium content of one or both cladding layers in a region closest to the waveguide amounts to at least 0.5%, preferably at least 1%.

According to at least one embodiment of the semiconductor chip, one or both cladding layers are thin. Thin may mean that the thickness of the cladding layer amounts to at most 500 nm. The thickness here preferably amounts to at least 200 nm or at least 300 nm.

According to at least one embodiment of the semiconductor chip, the average aluminium content of one or both cladding layers amounts to between 0.1% and 30% inclusive or between 1% and 12% inclusive or between 3% and 8% inclusive. It is possible that the local aluminium content throughout the cladding layer does not depart from the stated value ranges. The stated values apply in particular with thin cladding layers.

According to at least one embodiment of the semiconductor chip, the optical refractive index in at least one or in both cladding layers has a stepped or ramp-shaped profile. The two notional halves, of identical thickness, of the cladding layer exhibit different average optical refractive indices. The first half closer to the waveguide exhibits a lower average refractive index than the second half. The difference in refractive index between the halves is preferably between 0.0001 and 0.2 inclusive or between 0.001 and 0.08 inclusive or between 0.001 and 0.03 inclusive.

In the case of a stepped profile, the refractive index differences between adjacent steps are preferably between 0.0001 and 0.2 inclusive or between 0.001 and 0.1 inclusive or between 0.002 and 0.03 inclusive.

According to at least one embodiment of the semiconductor chip, the p-cladding layer consists of InGaAlN, wherein the InGaAlN may be doped. The thickness of the p-cladding layer is between 100 nm and 5000 nm inclusive, preferably between 200 nm and 2000 nm inclusive or between 400 nm and 900 nm inclusive. The average aluminium content of the p-cladding layer is between 0.1% and 20% inclusive or between 3% and 10% inclusive or between 4% and 8% inclusive.

According to at least one embodiment of the semiconductor chip, the total thickness of the waveguide, i.e., in particular the distance between the p-cladding layer and the n-cladding layer, is between 50 nm and 2000 nm inclusive or between 200 nm and 1200 nm inclusive or between 400 nm and 800 nm inclusive.

According to at least one embodiment of the optoelectronic semiconductor chip, the latter is a laser chip with one or with multiple separate or contiguous laser-active regions, a ridge laser, a stripline laser, a laser bar or a light-emitting diode.

The stated exemplary embodiments can be combined with one another, provided this does not result in any contradictions. The optoelectronic semiconductor chip is in particular constructed according to a plurality of the stated exemplary embodiments.

BRIEF DESCRIPTION OF THE DRAWINGS

An optoelectronic semiconductor chip described here will be explained in greater detail below with reference to the drawings and with the aid of exemplary embodiments. Elements which are the same in the individual figures are indicated with the same reference numerals. The relationships between the elements are not shown to scale, however, but rather individual elements may be shown exaggeratedly large to assist in understanding.

FIGS. 4 to 7, 10 to 14, 16 to 18, 20, 23 and 24 are schematic representations of exemplary embodiments of optoelectronic semiconductor chips described herein.

Figure 17:
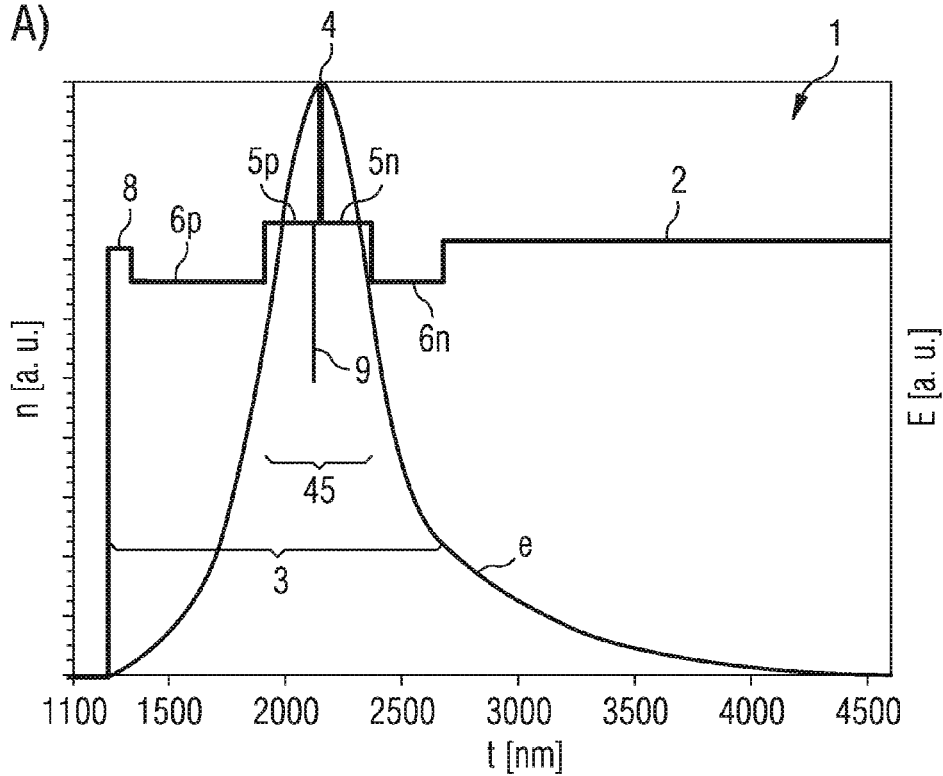
Figure 17:
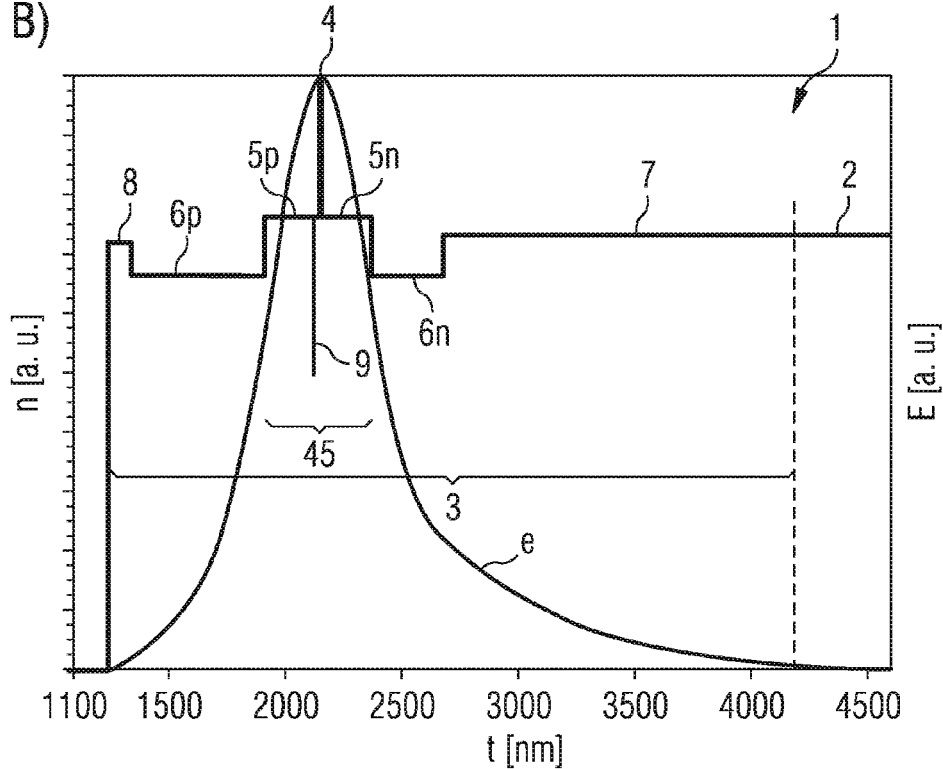
Figure 22:
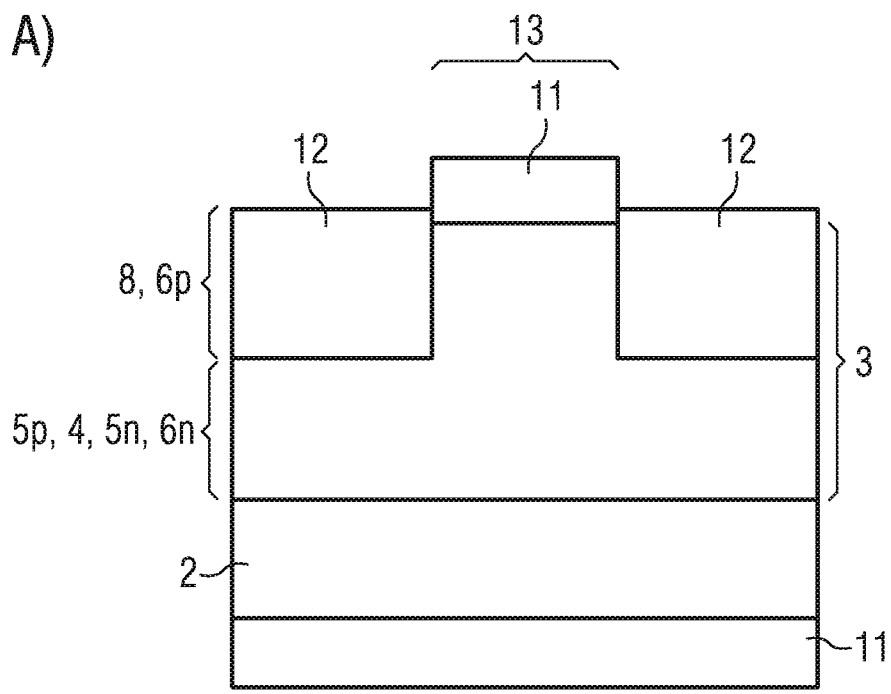
Figure 22:
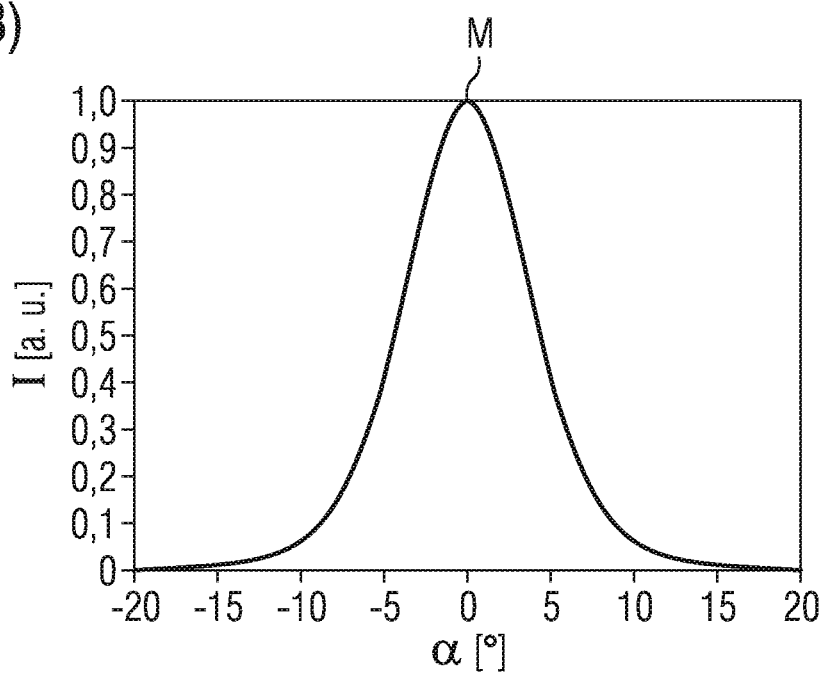

With the exception of FIGS. 17 and 22, in each of the A parts of the figures a refractive index profile is plotted in arbitrary units over a depth t, which is oriented parallel to a direction of growth of the semiconductor layer sequence. The A figures also plot in arbitrary units a profile e of an electrical field E over the depth t. In the B figures an intensity I of an optical far field is plotted in arbitrary units relative to an emission angle α, stated in degrees. The representation of FIGS. 17A, 17B and 17C corresponds in each case to the A parts of the other figures.

DETAILED DESCRIPTION OF ILLUSTRATIVE EMBODIMENTS

Figure 1:
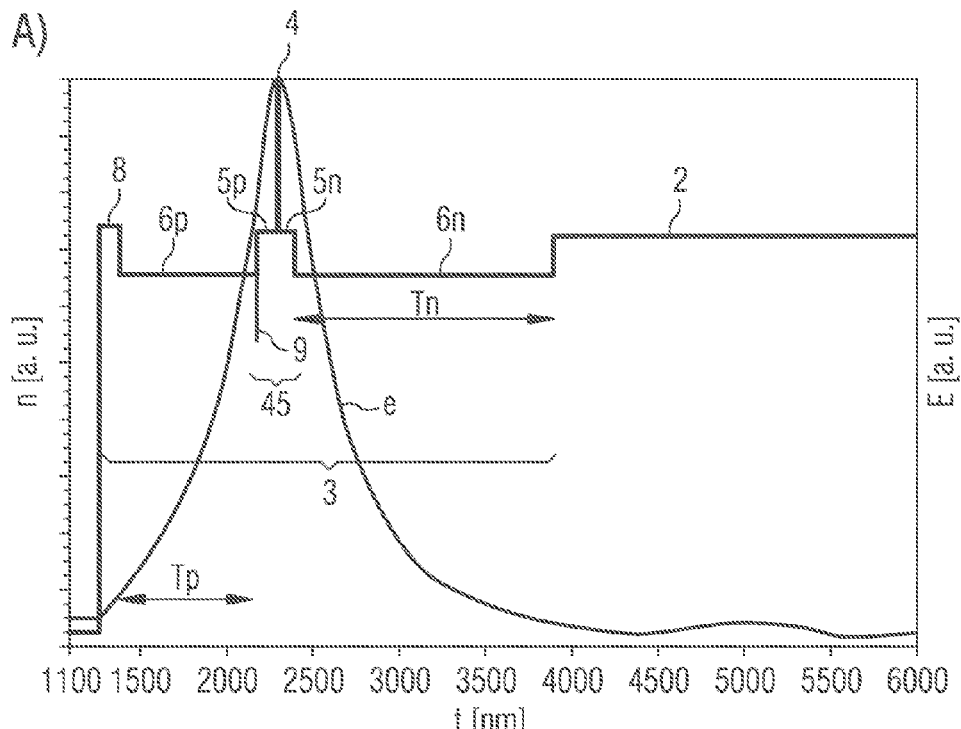
FIGS. 1 to 3, 8, 9, 15, 19, 21 and 22 are schematic representations of laser diodes.
Figure 1:
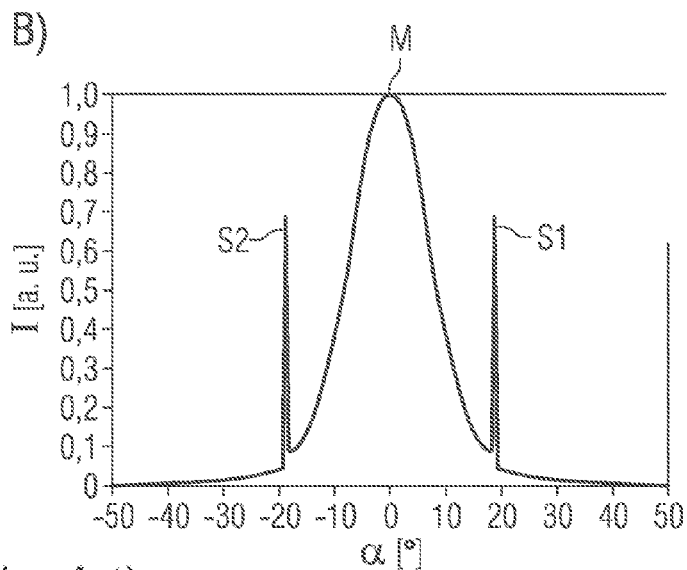

FIG. 1 shows the structure of a conventional laser diode. A semiconductor layer sequence 3 is grown on a carrier 2. The semiconductor layer sequence 3 comprises an active zone 4 with quantum films, distinguished in the figures by a region with an increased refractive index. The active zone 4 is located between two waveguide layers 5n, 5p, which directly adjoin the active zone 4. The waveguide layer 5n, when viewed towards the carrier 2, away from the active zone 4, is n-doped, the other waveguide layer 5p being p-doped. The active zone 4 and the waveguide layers 5n, 5p form the waveguide 45, in which an optical mode M is guided. The mode is emitted at an emission angle α of around 0°, i.e., perpendicular to a lateral boundary face of the semiconductor layer sequence 3.

Away from the active zone 4 towards the carrier 2 the n-waveguide layer 5n is adjoined by an n-doped n-cladding layer 6n. In a direction away from the carrier 2, starting from the active zone 4, the p-waveguide layer 5p is adjoined by an electron barrier 9 and a p-doped p-cladding layer 6p, followed by a contact layer 8. The refractive indices of the cladding layers 6n, 6p are lower than a refractive index of the carrier 2.

A thickness Tn of the n-cladding layer 6n amounts to around 1500 nm. A thickness Tp of the p-cladding layer 6p amounts to around 800 nm. Due to the comparatively small thickness Tn of the n-cladding layer 6n, an evanescent field within the cladding layer 6n has not yet decayed and penetrates into the transparent carrier 2. Since an effective refractive index for the guided mode M in the waveguide 45 is lower than the refractive index of the carrier 2, an electrical field may build up in the carrier 2, see the hump in the profile e of the electrical field E in FIG. 1A at around 5000 nm. This electrical field in the carrier 2 is manifested in the optical far field as an additional band S1 at an angle α of around 20°. A further parasitic mode S2 may likewise occur at an angle of −20°. These one or two additional, parasitic modes S1, S2 result in difficulties in the event of the laser chip according to FIG. 1A being used for projection or data storage purposes.

The effective refractive index of the guided mode M is equal to the product of the propagation constant β and the wavelength λ of the radiation, divided by 2. The propagation constant β is dependent on the order of the guided mode, i.e., in particular on the distribution of the electrical field in a plane perpendicular to a direction of propagation of the radiation, along which the waveguide guides the field. The field distribution perpendicular to the direction of propagation is in turn dependent on the refractive index and on the thickness of the cladding layers 6n, 6p and on the refractive index and structure of the waveguide 45.

In particular, therefore, in the case of a given waveguide 45, especially with a given active zone 4, the electrical field perpendicular to the direction of propagation and thus the propagation constant β of the mode guided in the waveguide 45 may be influenced by a refractive index of the cladding layers 6n, 6p and by the thickness thereof. The propagation constant β and the electrical field may be computed or simulated perpendicular to a direction of propagation. The electrical field or the square of the electrical field, the intensity distribution, may likewise be determined experimentally.

Figure 2:
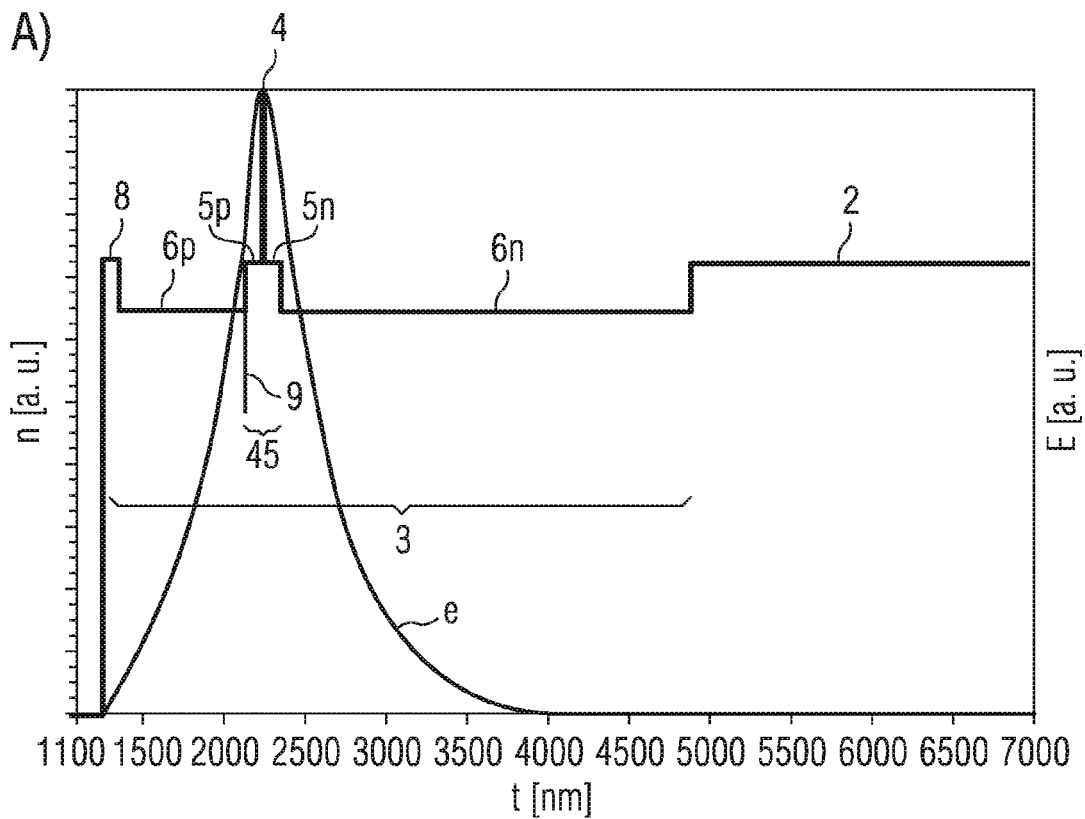
Figure 2:
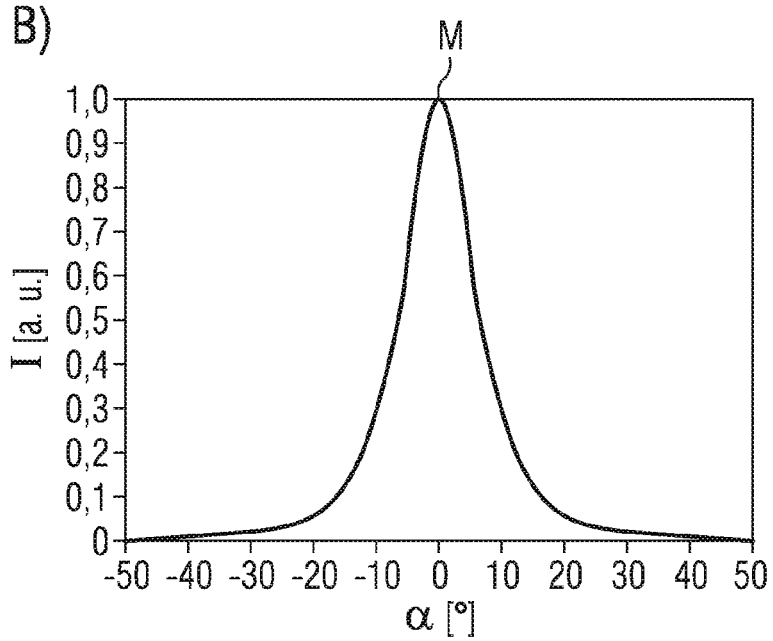

In the case of the laser diode according to FIG. 2, the thickness of the n-cladding layer 6n is increased to around 2.5 μm. The aluminium content of the n-cladding layer 6n based on AlGaN is around 5% to 10%, as also according to FIG. 1. The effective refractive index of the guided mode M is in this case less than the refractive index of the carrier 2. Through the increased thickness of the n-cladding layer 6n as compared with FIG. 1, the evanescent field within the cladding layer 6n decays to the extent that no additional mode may form in the carrier 2.

However, layers such as this cladding layer 6n, which has a comparatively high aluminium content, grow only under strain on GaN. Such strains on the one hand impair growth quality and on the other hand cracks may form in layers of the semiconductor layer sequence, which may lead to damage to the component. The comparatively large thickness required also increases growth times and thus manufacturing costs. Comparatively thick cladding layers with a relatively high aluminium content thus impair component quality and lead to elevated manufacturing costs.

Figure 3:
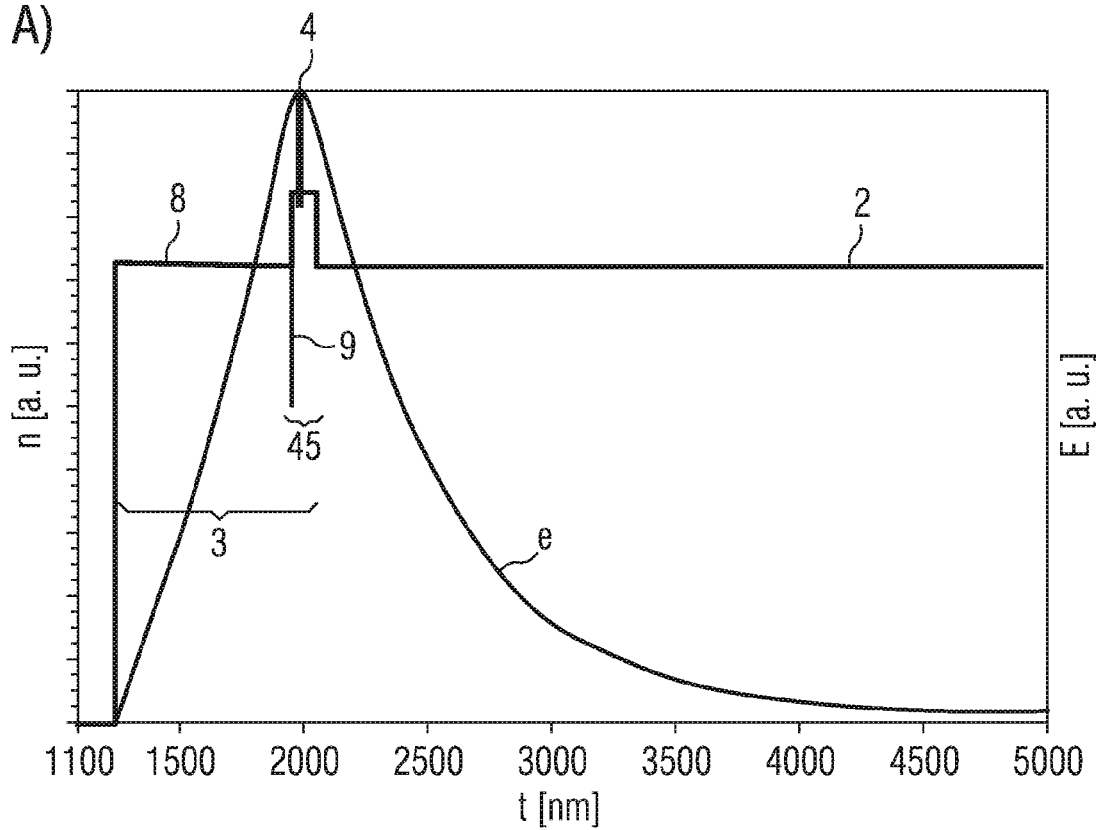
Figure 3:
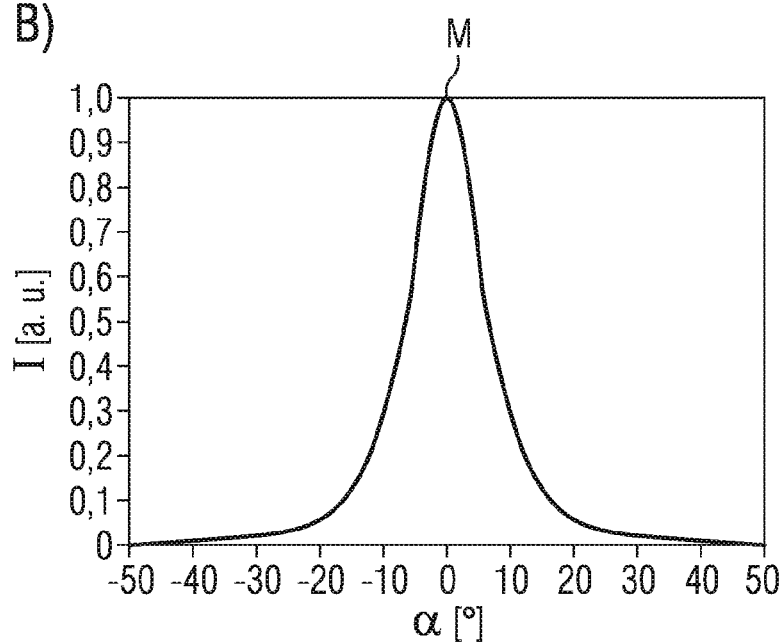

In the case of the laser diode according to FIG. 3, the cladding layers are replaced by layers based on GaN without a significant aluminium content, the laser diode thus not comprising any cladding layers with a lower refractive index than that of the carrier 2. The waveguide 45 is based on InGaN. Due to the higher refractive index of the InGaN-based waveguide 45, no parasitic mode may form in the carrier 2. However, relatively high indium contents are required in the waveguide 45, resulting in poorer material quality. In the case of epitaxially readily producible indium contents, on the other hand, the fill factor, i.e., an intensity overlap between the guided mode M and the active zone 4, is relatively low, resulting in comparatively low amplification in the active zone 4. Furthermore, a comparatively very thick layer 8 is necessary, to avoid an evanescent field arriving at a p-contact, not shown in FIG. 3, on a side of the semiconductor layer sequence 3 remote from the carrier 2. In other words, the laser diode according to FIG. 3 is likewise expensive to produce and exhibits comparatively low efficiency.

Figure 4:
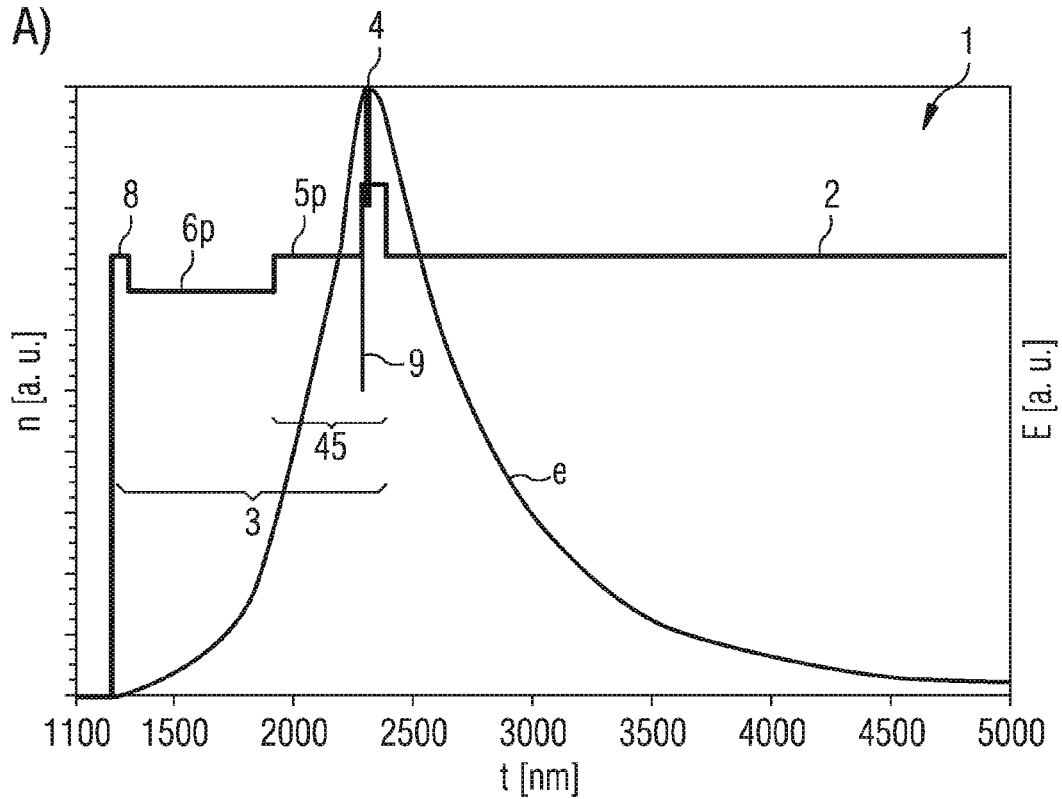
Figure 4:
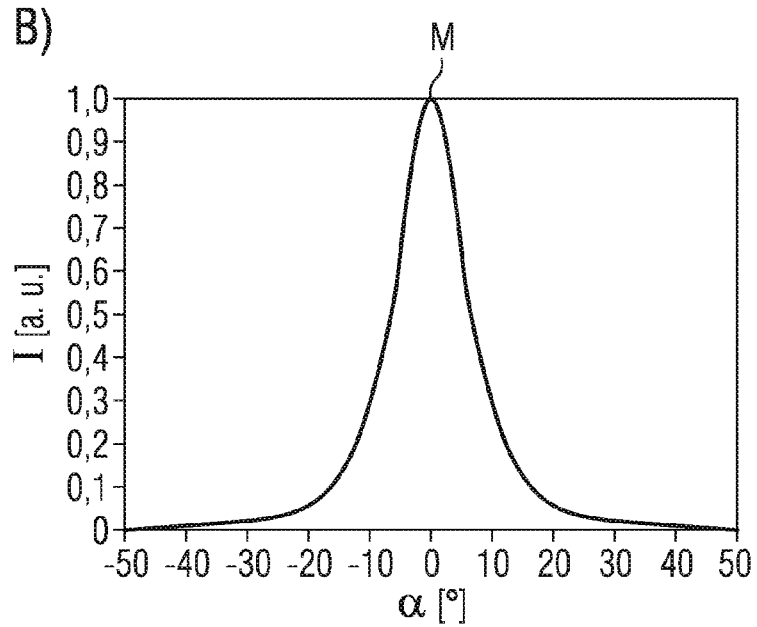

FIG. 4 shows an exemplary embodiment of an optoelectronic semiconductor chip 1. A p-cladding layer 6p is produced on a side of the waveguide 45 remote from the carrier 2. The p-cladding layer 6p brings about improved shielding of the evanescent fields relative to a p-contact, not shown, in comparison with the laser diode according to FIG. 3. A higher fill factor may additionally be achieved, which amounts to around 2.4% in the exemplary embodiment according to FIG. 4.

AlGaN or AlInN or AlInGaN may for example be used as materials for the p-cladding layer 6p. AlInGaN-containing layers may in particular be grown on GaN with good lattice adaptation. In contrast to what is shown in FIG. 4, it is possible for the cladding layer 6p to comprise a superlattice structure.

If the cladding layer 6p is based on AlGaN, the aluminium content is for example between 0.01% and 30% inclusive, preferably between 1% and 12% inclusive, particularly preferably between 3% and 8% inclusive. If AlInN is used as the base material for the cladding layer 6p, the aluminium content preferably amounts to between 74% and 90% inclusive, particularly preferably between 79% and 85% inclusive, in particular to around 82%. In the case of AlInGaN, $Ga_x(Al_{82}In_{18})_{1-x}N$ is preferably used, wherein the aluminium content may deviate by up to 8 percentage points from the stated value of 82% and x is preferably between 0.01 and 0.3 inclusive. The thickness of the p-cladding layer 6p is preferably between 10 nm and 1500 nm inclusive, particularly preferably between 100 nm and 1000 nm inclusive. The stated materials and thicknesses may also be used for the p-cladding layers 6p in all the other exemplary embodiments.

Figure 5:
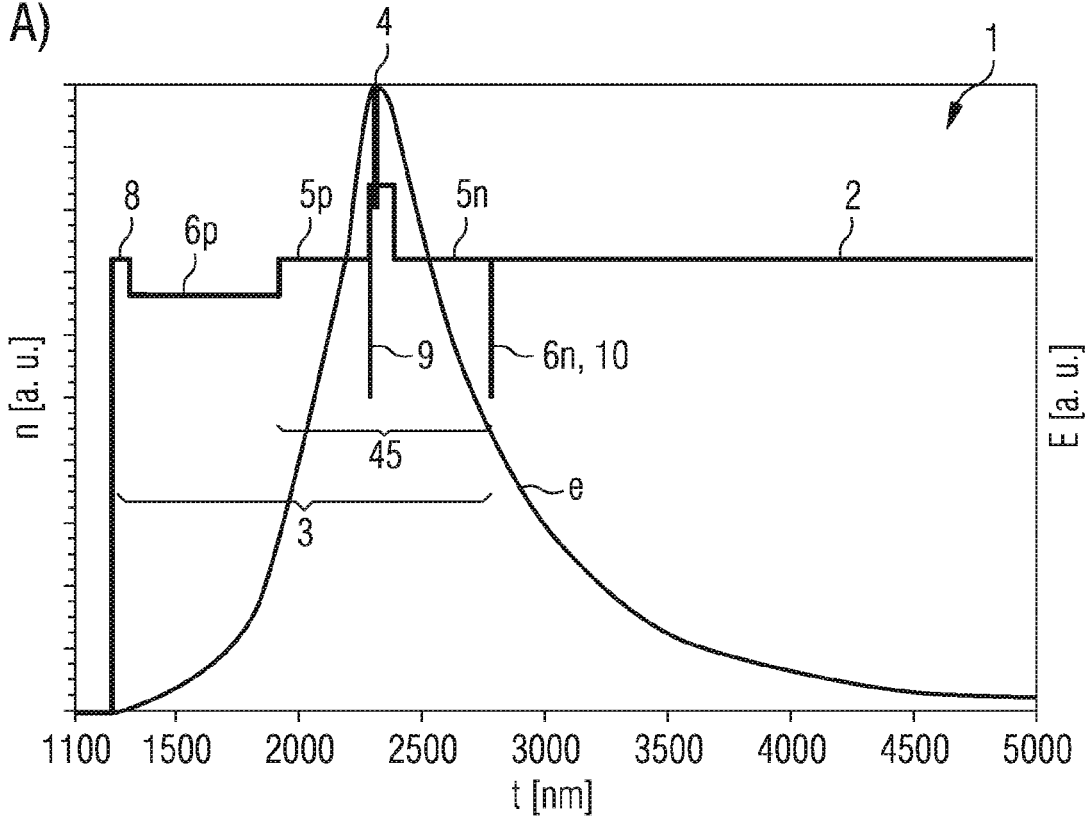
Figure 5:
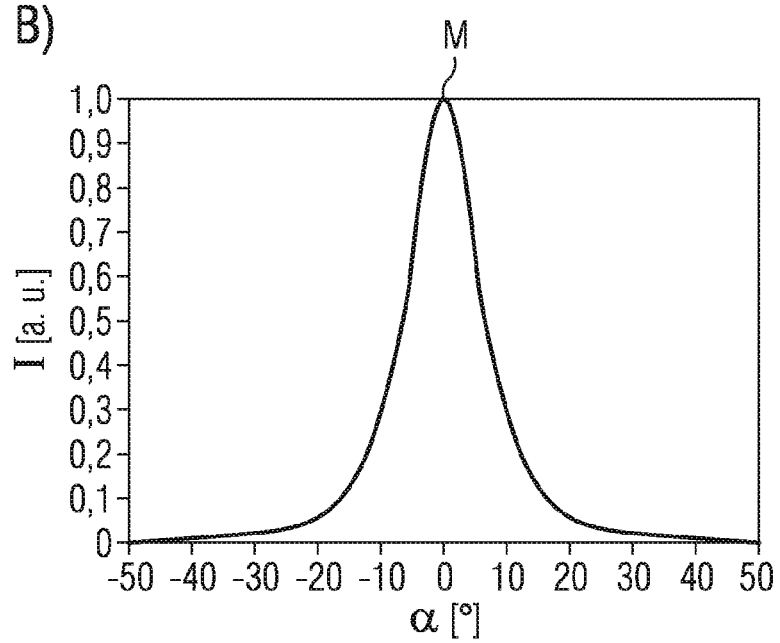

In the exemplary embodiment according to FIG. 5, a hole barrier layer 10, based on AlGaN, takes the form of an n-cladding layer 6n. As a result of the hole barrier layer 10, the fill factor increases to around 2.6%. Furthermore, hole injection into the active zone 4 is improved, such that the efficiency of the semiconductor laser 1 increases.

The hole barrier layer 10, which forms the n-cladding layer 6n, may be based on the same materials as the p-cladding layer 6p mentioned in connection with FIG. 4. However, the n-cladding layer 6n is preferably n-doped. The thickness of the n-cladding layer 6n or the hole barrier layer 10 is preferably between 1 nm and 50 nm inclusive. In the case of AlGaN as the base material, the aluminium content is preferably between 1% and 100% inclusive, in particular between 3% and 40% inclusive, particularly preferably between 3% and 20% inclusive. The stated values may also be applied in all the other exemplary embodiments.

Figure 6:
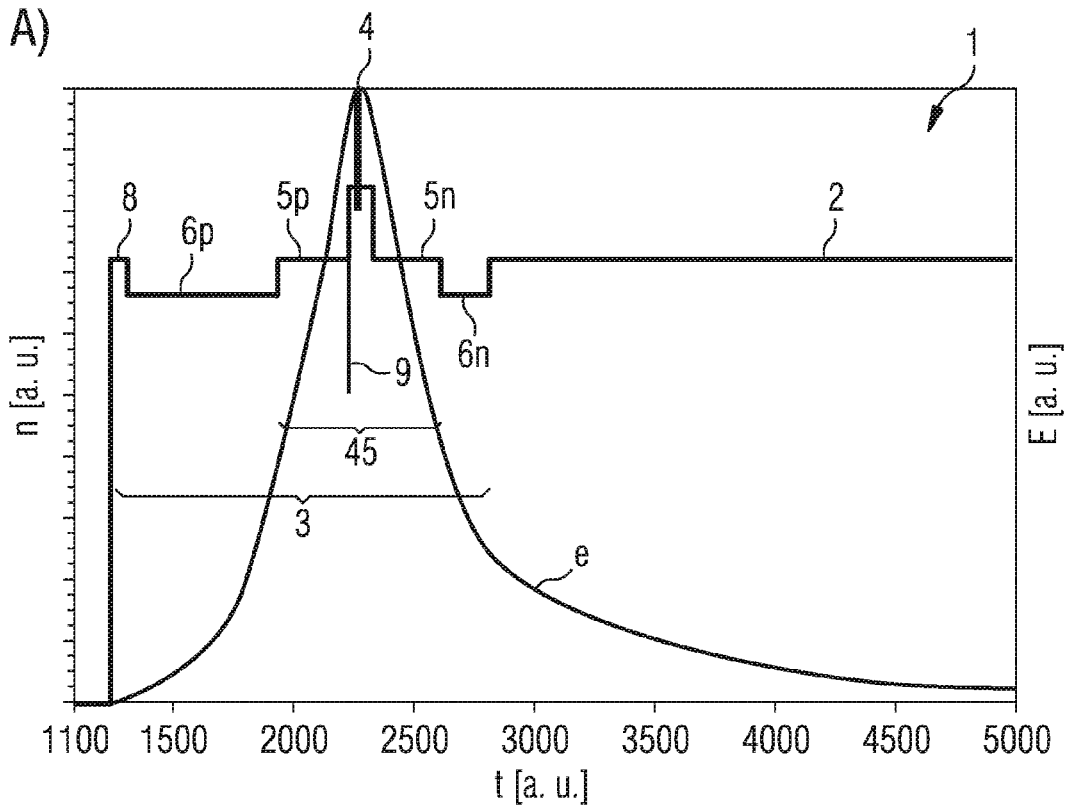
Figure 6:
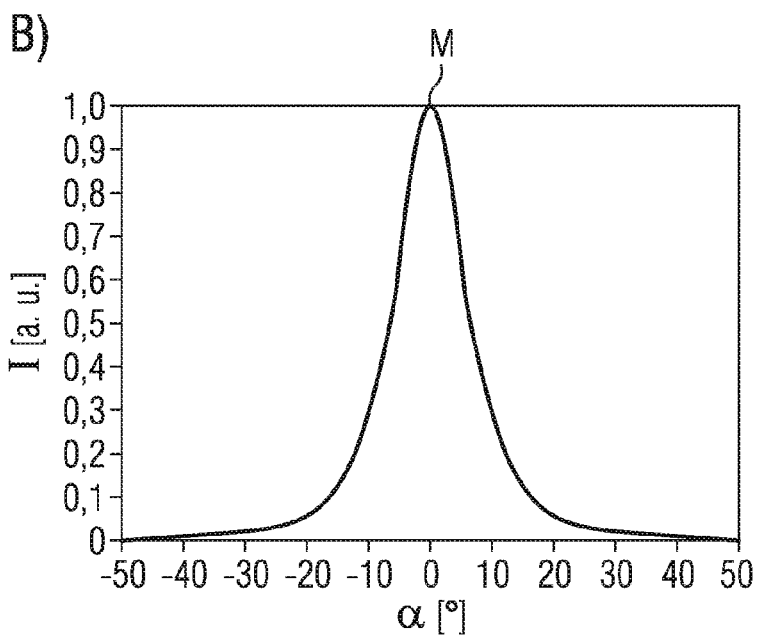
Figure 8:
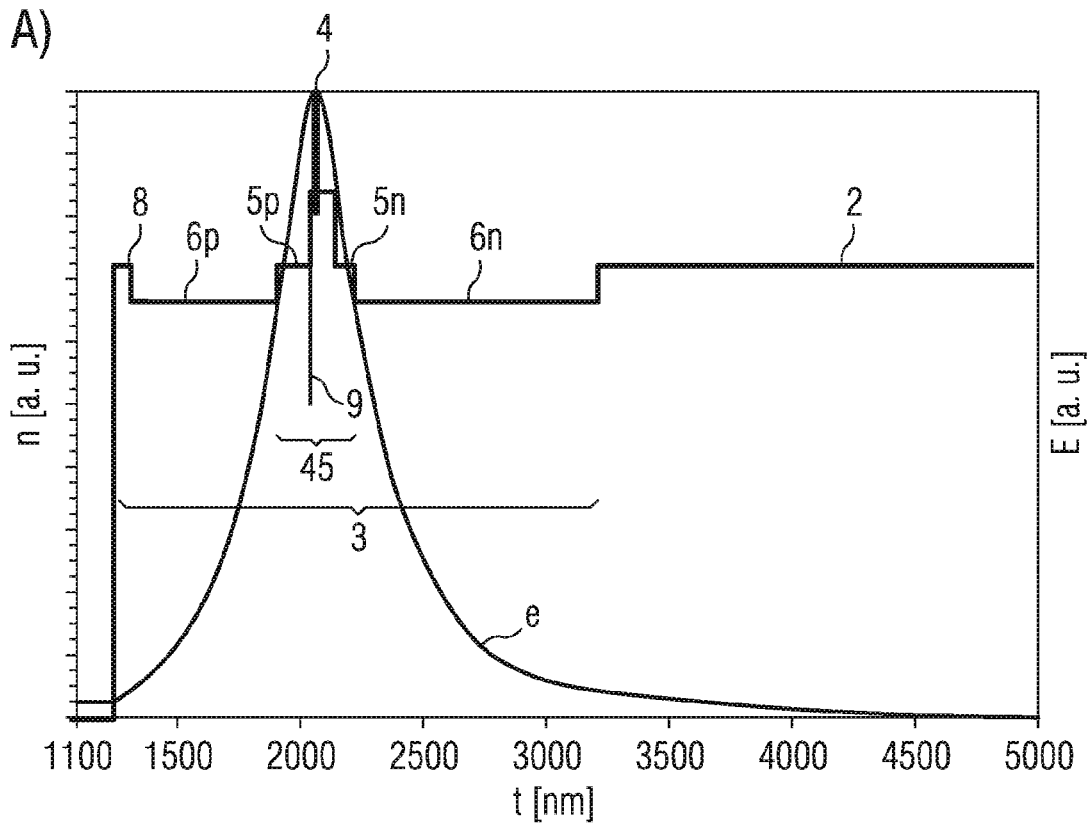
Figure 8:
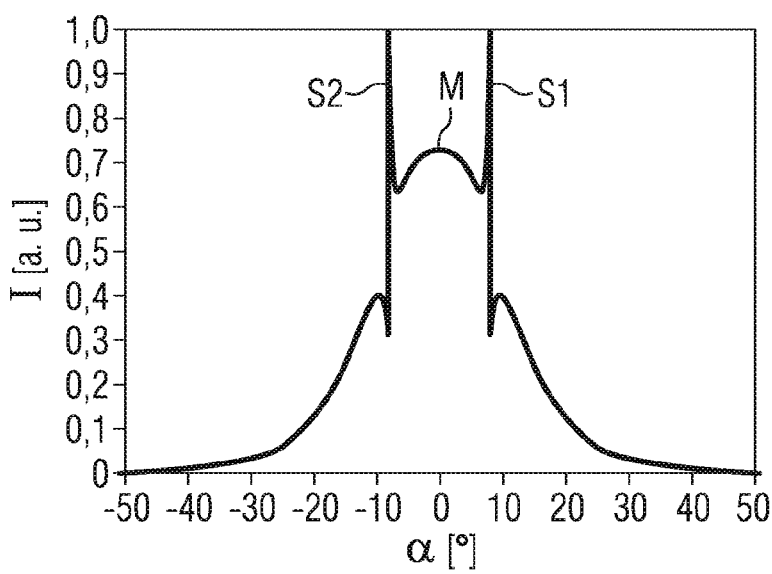

In the exemplary embodiment of the semiconductor chip 1 according to FIG. 6, instead of the hole barrier layer 10 the cladding layer 6n is formed by an AlGaN layer with the same aluminium content as the p-cladding layer 6p, the n-cladding layer 6n being around 200 nm thick. The fill factor in the exemplary embodiment according to FIG. 6 amounts to around 2.8%. The greater the thickness of the n-cladding layer 6n according to FIG. 6, the lower the effective refractive index of the guided mode M. An excessively thick n-cladding layer 6n must not therefore be selected. If an excessively large thickness of the n-cladding layer 6n is selected, as with the laser diode according to FIG. 8, in which the thickness amounts to around 1000 nm, parasitic modes S1, S2 arise, see FIG. 8B.

Figure 7:
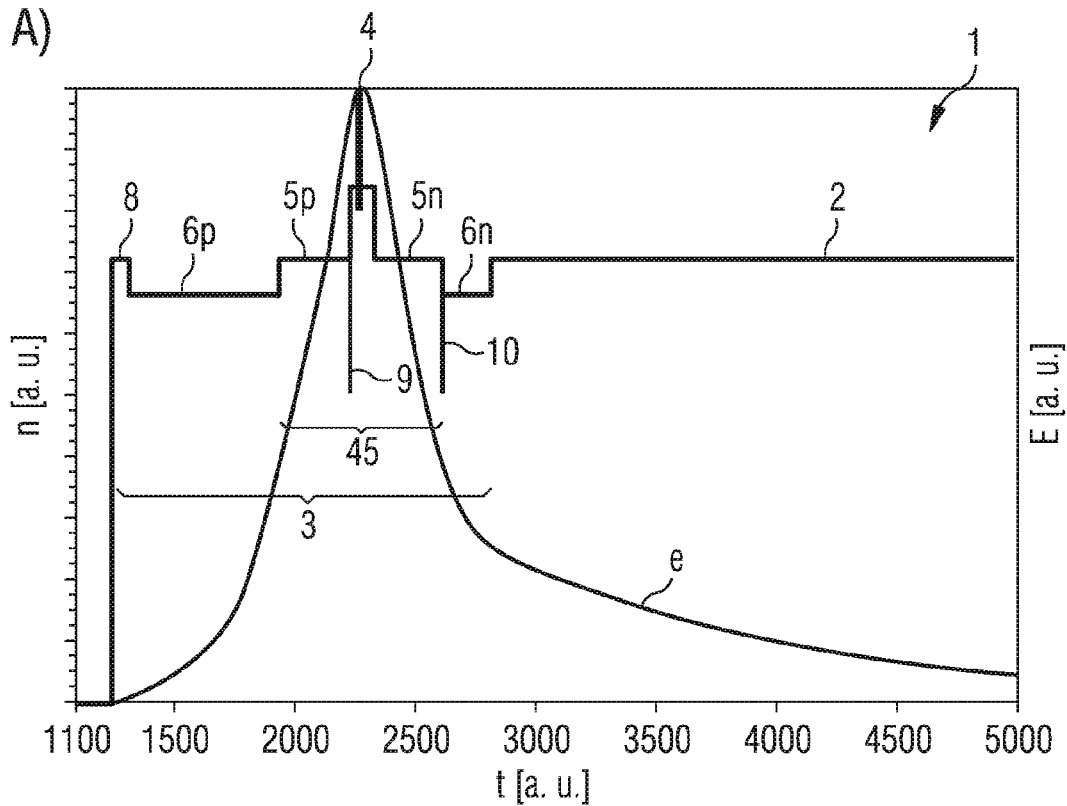
Figure 7:
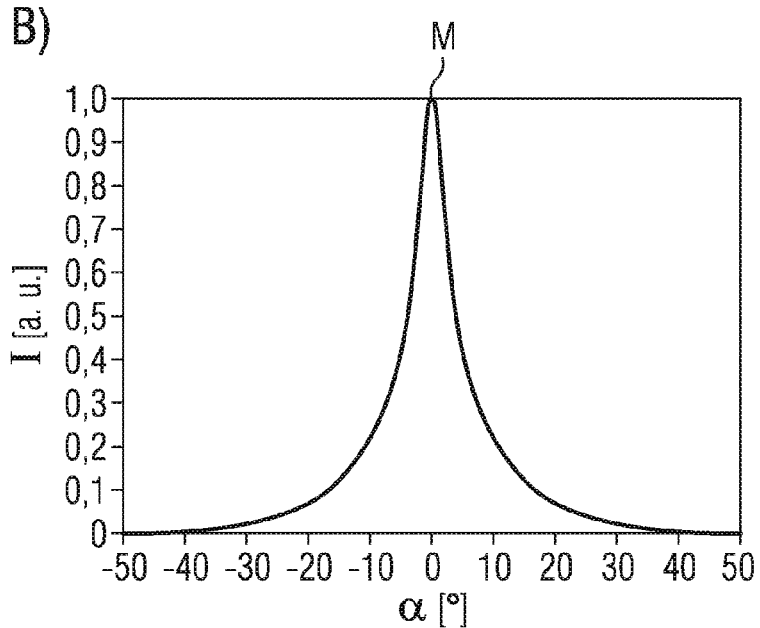

In the exemplary embodiment according to FIG. 7, the semiconductor chip 1 comprises cladding layers 6n, 6p with mutually different refractive indices and aluminium contents. According to FIG. 7, the aluminium content of the n-cladding layer 6n amounts to around 5%, while the aluminium content of the hole barrier 10 amounts to around 20%. The fill factor amounts to around 3.7% and is thus comparatively high.

Figure 9:
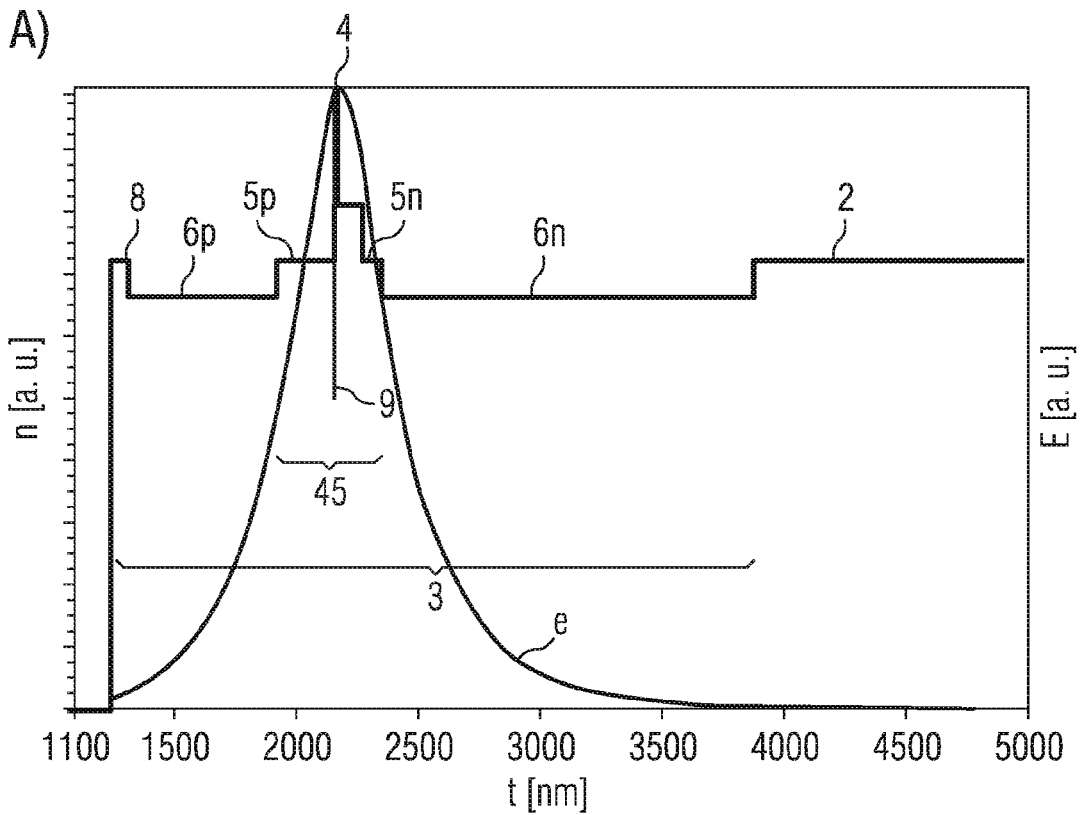
Figure 9:
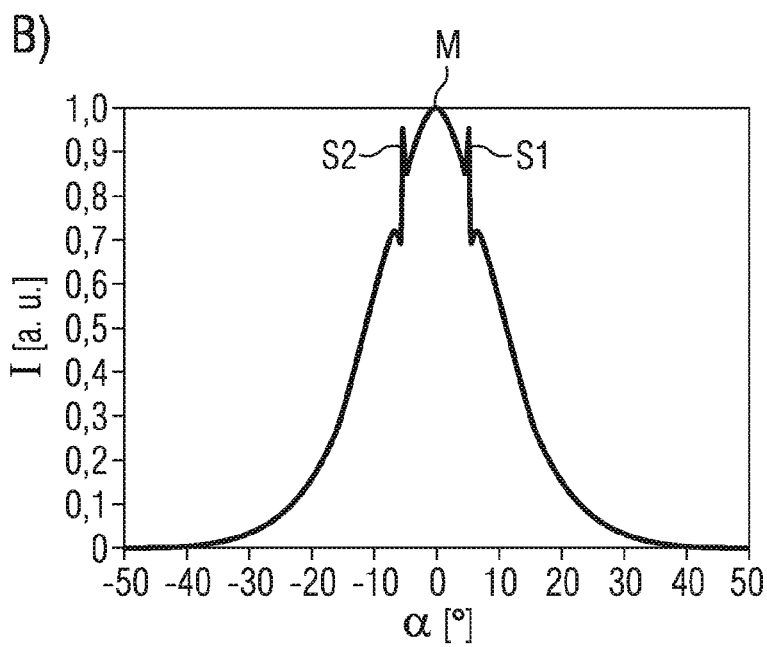

In the case of the laser diode according to FIG. 9, the thickness of the n-cladding layer 6n amounts to around 1.5 μm and the aluminium content of the n-cladding layer 6n based on AlGaN is around 5%. As a result, the evanescent field is insufficiently shielded from the carrier 2, whereby parasitic modes S1, S2 form.

Figure 10:
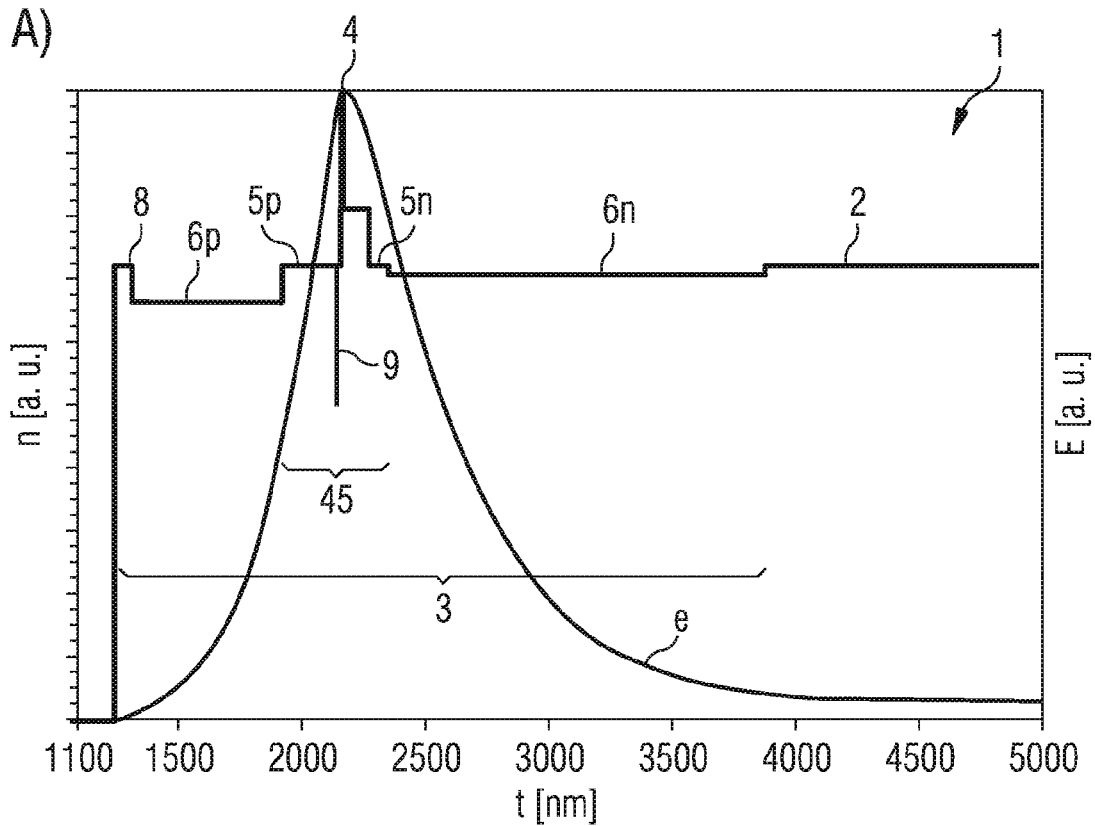
Figure 10:
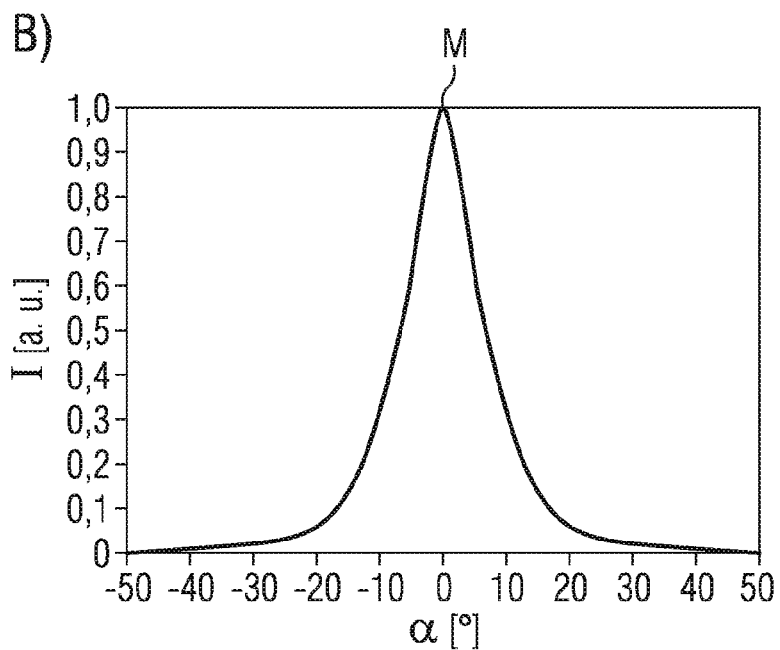

If, however, the aluminium content of the cladding layer is reduced to around 1%, see the exemplary embodiment according to FIG. 10, there is no further chance of a parasitic mode occurring, since the effective refractive index for the guided mode M is greater than the refractive index of the carrier 2. In other words, it is important in this exemplary embodiment for the product of the thickness of the n-cladding layer 6n and a refractive index difference between the n-cladding layer 6n and the adjacent waveguide 45 not to be excessively large, the refractive index difference being determined in particular by the aluminium content of the layers. A greater thickness accordingly entails a lower aluminium content and vice versa.

Depending on the aluminium content and thickness of the n-cladding layer 6n, which must be matched to one another, the thickness thereof is in particular in the range between 0.1 nm and 2000 nm, preferably between 1 nm and 1000 nm inclusive, particularly preferably between 5 nm and 500 nm inclusive. In the case of AlGaN being used as base material for the n-cladding layer 6n, the aluminium content is in particular between 0.01% and 100% inclusive, preferably between 0.01% and 20% inclusive, particularly preferably between 0.1% and 10%, inclusive. This may also apply to all the other exemplary embodiments. As in the case of the p-cladding layer according to FIG. 4, in the present exemplary embodiment too AlGaN, AlInN or AlInGaN and superlattices and/or combinations thereof may also be used as base materials in the present exemplary embodiment.

Figure 11:
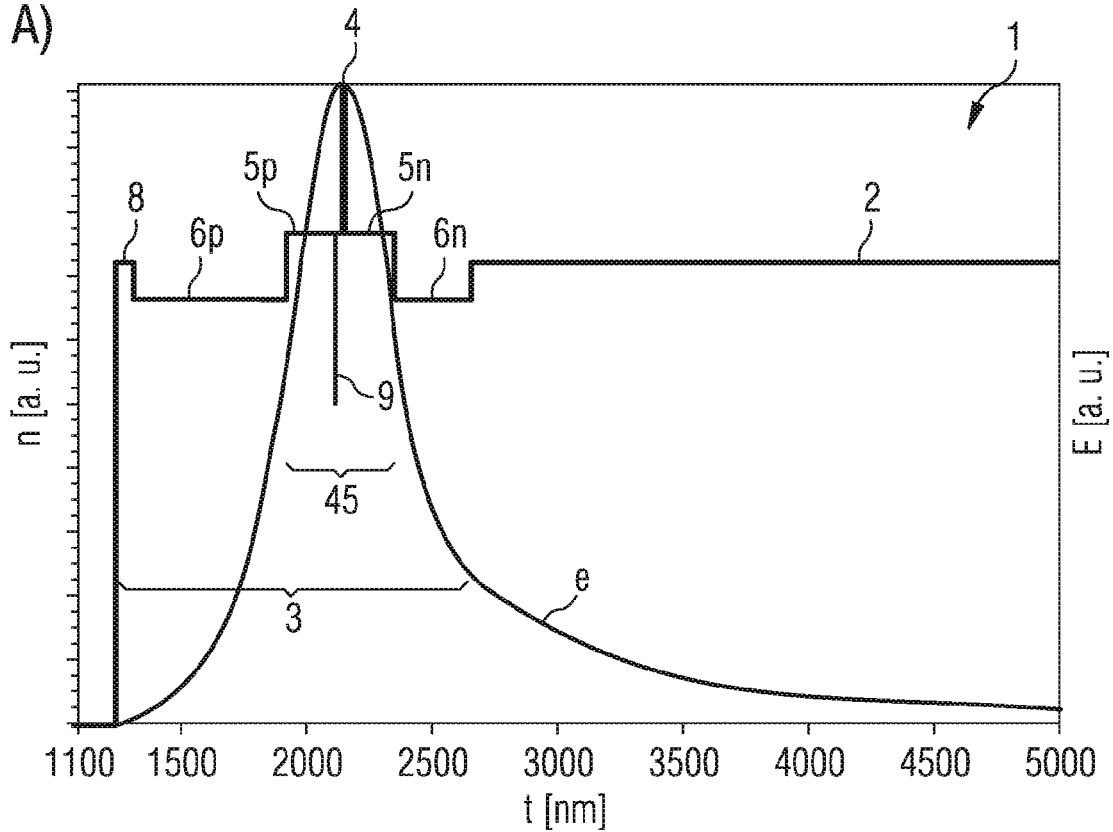
Figure 11:
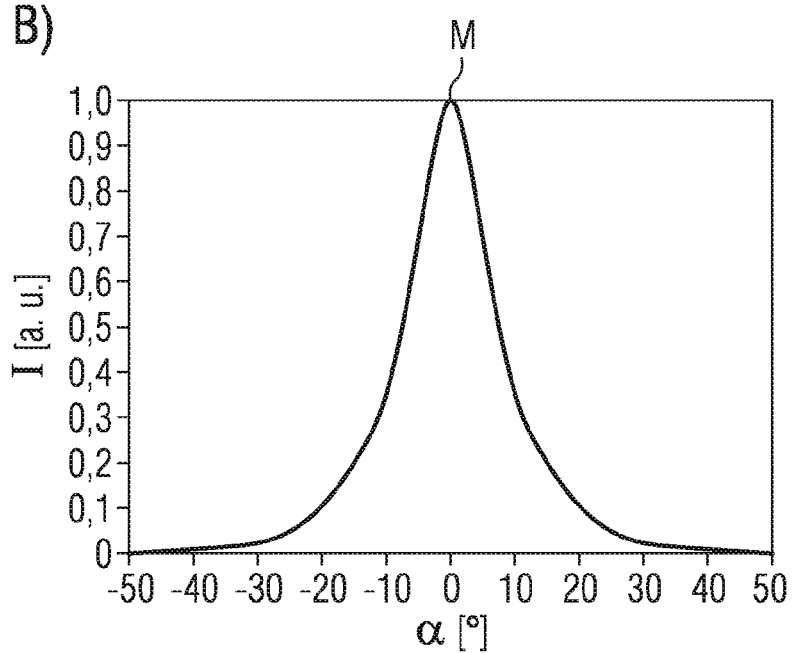

According to FIG. 11, the waveguide layers 5n, 5p are based on InGaN with an indium content of around 2%. The fill factor of the semiconductor chip 1 amounts in this exemplary embodiment to around 2.8%.

Figure 12:
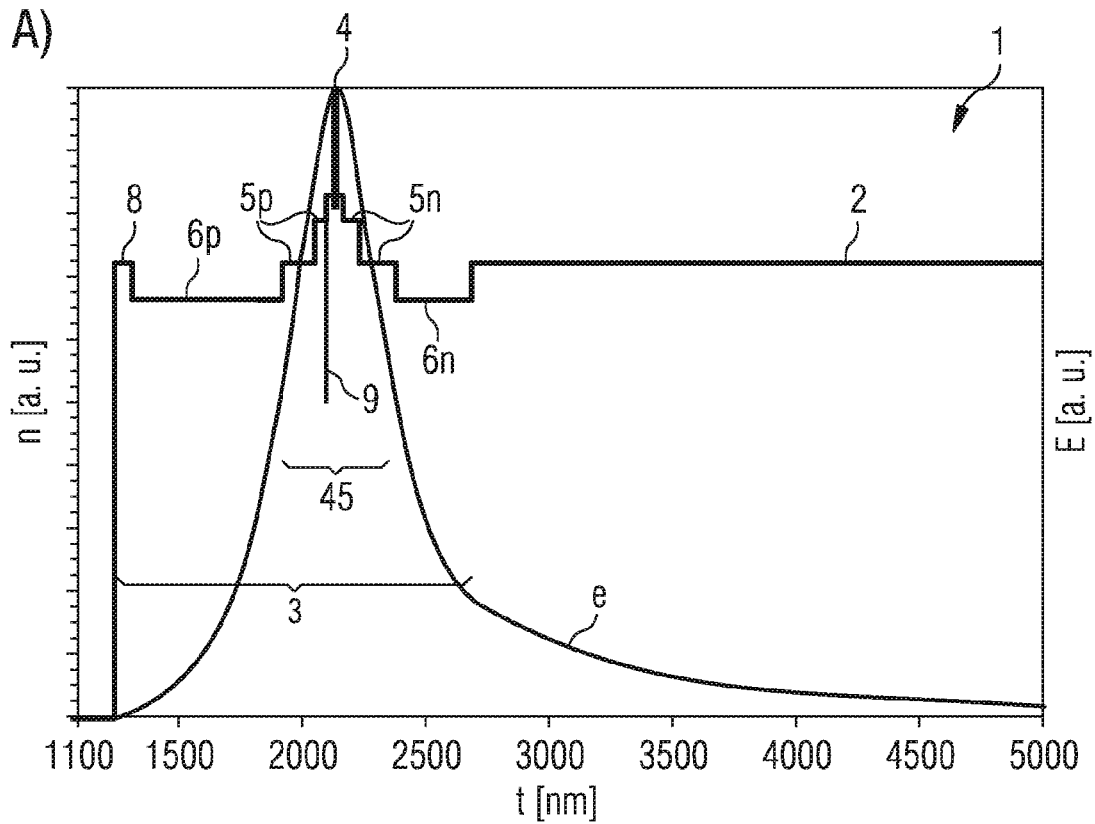
Figure 12:
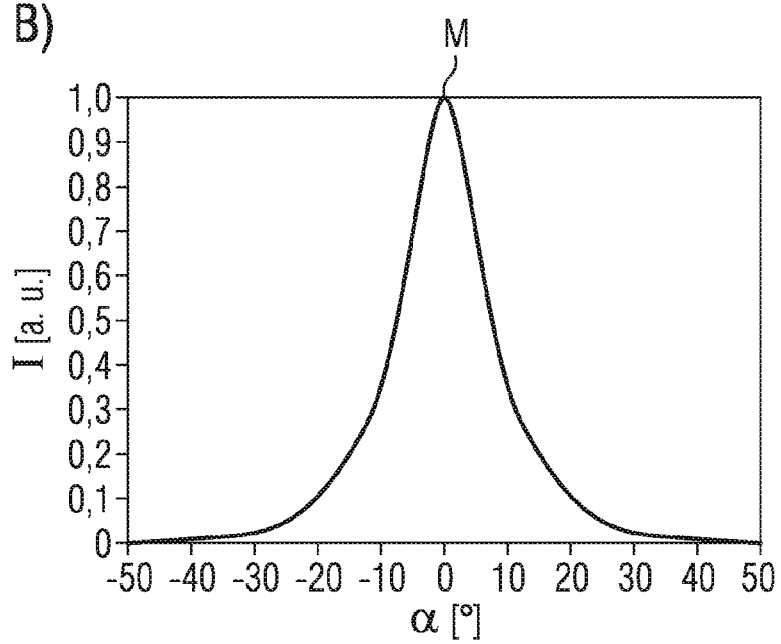

In the exemplary embodiment of the semiconductor chip 1 according to figure 12, the waveguide layers 5n, 5p are each of stepped construction with regard to their refractive index profile. A step of the stepped structure closer to the active zone 4 is for example formed by InGaN barriers with a high indium content, for example around 5. Away from the active zone 4, a second step is in each case formed, with an indium content of around 3. The fill factor amounts to around 3.2%.

As is also possible in all the other exemplary embodiments, the indium content of the waveguide layers 5n, 5p or the steps of the waveguide layers 5n, 5p is in each case preferably between 0% and 30% inclusive, in particular between 0.1% and 10% inclusive, particularly preferably between 1% and 6% inclusive. It is possible for one of the waveguides 5n, 5p to be based on GaN, and the other waveguide layer 5n, 5p to be based InGaN. The thicknesses of the waveguide layers 5n, 5p are for example in the range between 0.1 nm and 500 nm inclusive, preferably between 1 nm and 200 nm inclusive, particularly preferably between 10 nm and 100 nm inclusive.

Figure 13:
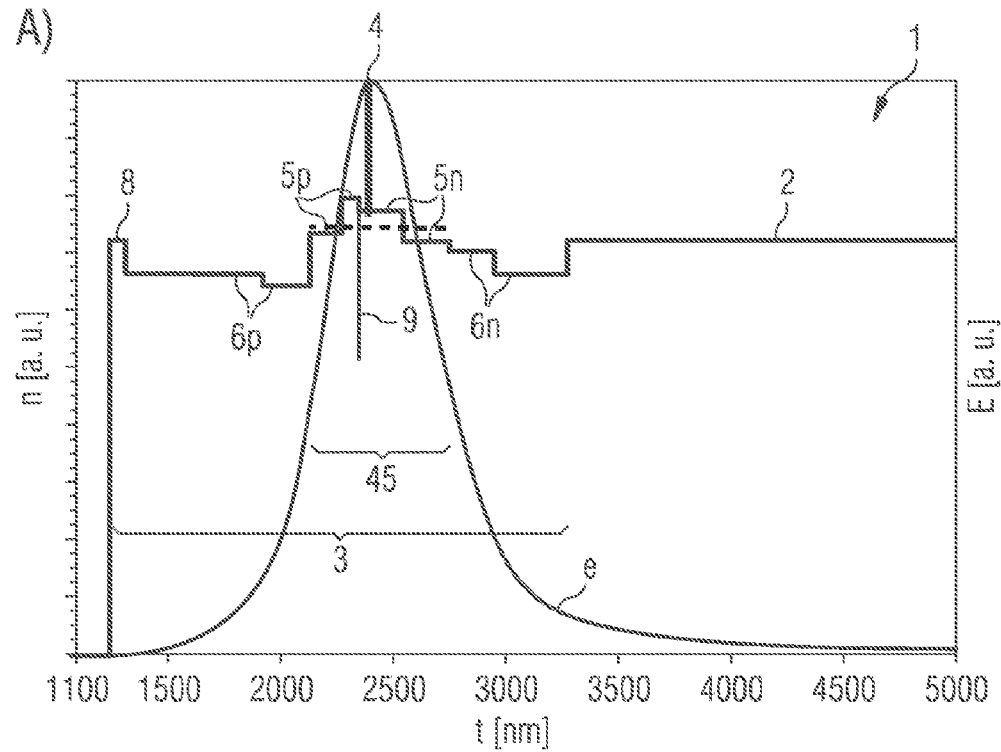
Figure 13:
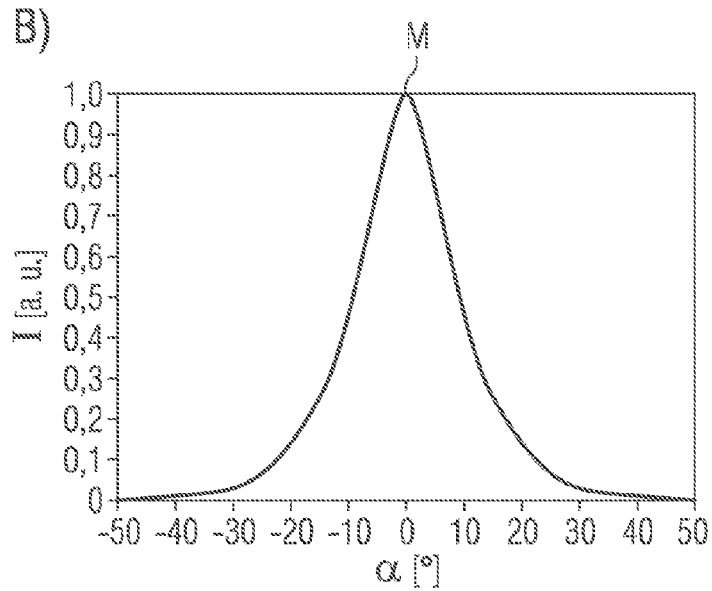

In the exemplary embodiment according to FIG. 13, both the waveguide layers 5n, 5p and the cladding layers 6n, 6p are of stepped construction. Towards the carrier, starting from the active zone 4, the refractive index of the waveguide layer 5n and of the cladding layer 6n declines monotonically. A sub-layer of the p-cladding layer 6p, which is located closer to the active zone 4, comprises a lower refractive index than a further sub-layer of the p-cladding layer 6 p, which is located further away from the active zone 4. Away from the carrier 2, starting from the active zone 4, the refractive index thus does not exhibit a monotonic, but rather an undulating profile. An effective refractive index of the mode guided in the waveguide is shown as a dashed line.

Figure 14:
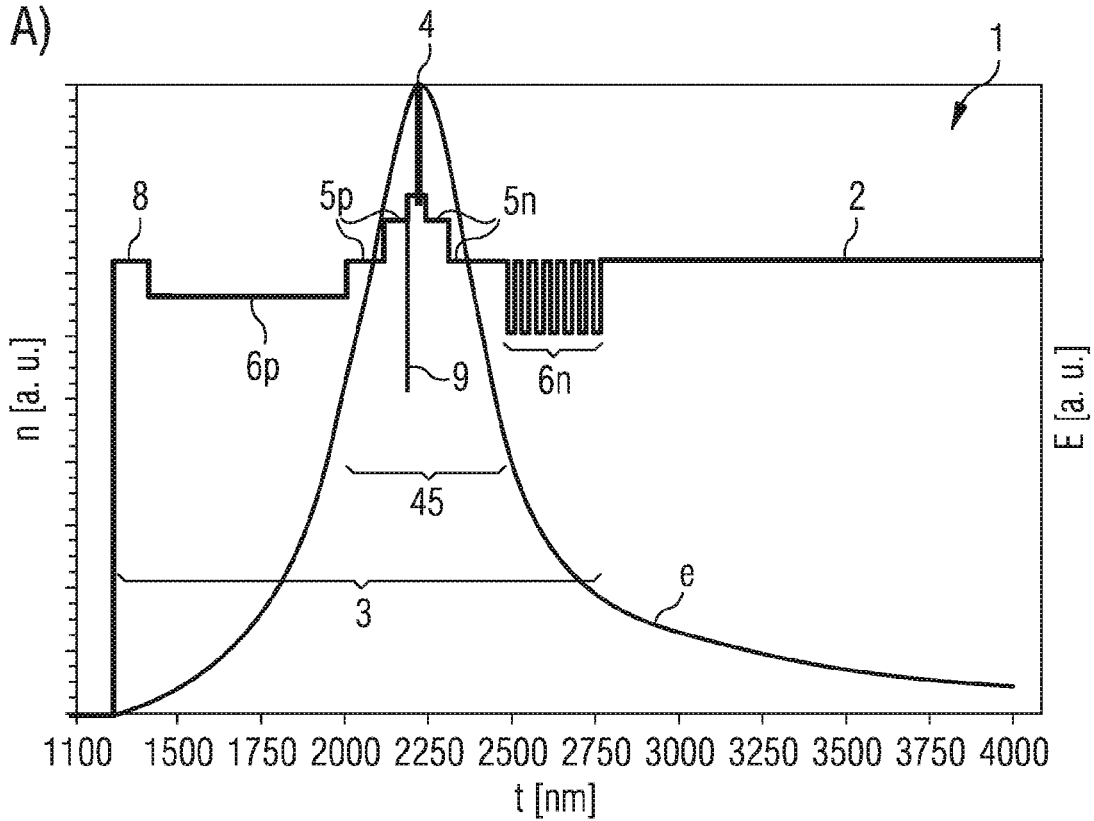
Figure 14:
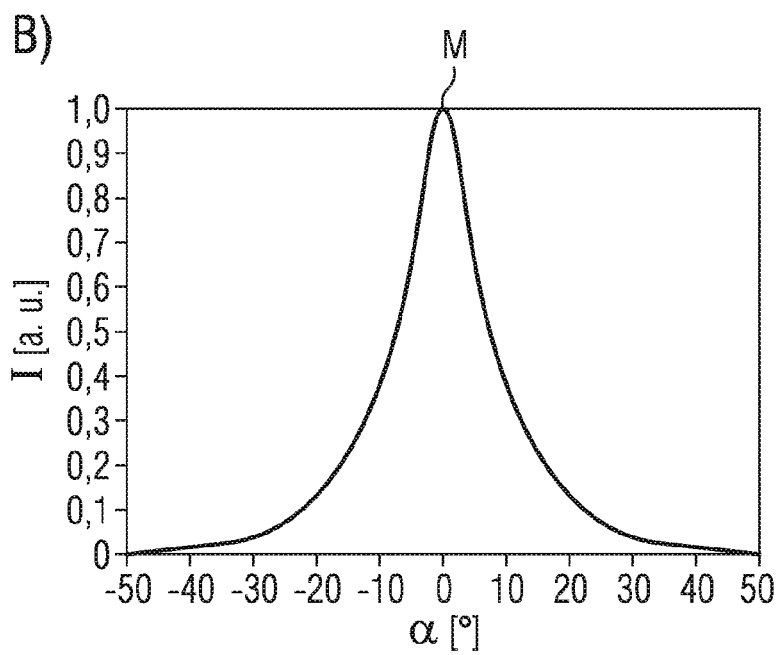

In the exemplary embodiment according to FIG. 14, the n-cladding layer 6n is formed by a superlattice structure. The superlattice structure comprises in particular between 2 and 300 layers inclusive with alternately high and low refractive indices. The low refractive index layers are based for example on AlGaN. The thickness of the layers is for example between 1 nm and 70 nm inclusive.

Figure 15:
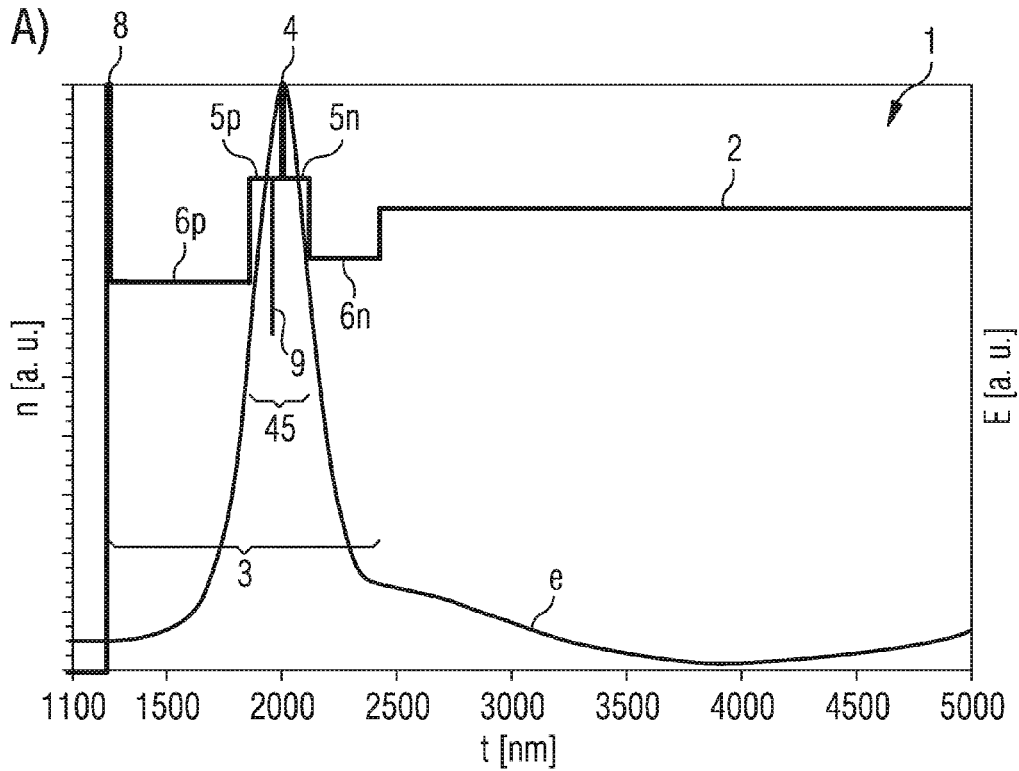
Figure 15:
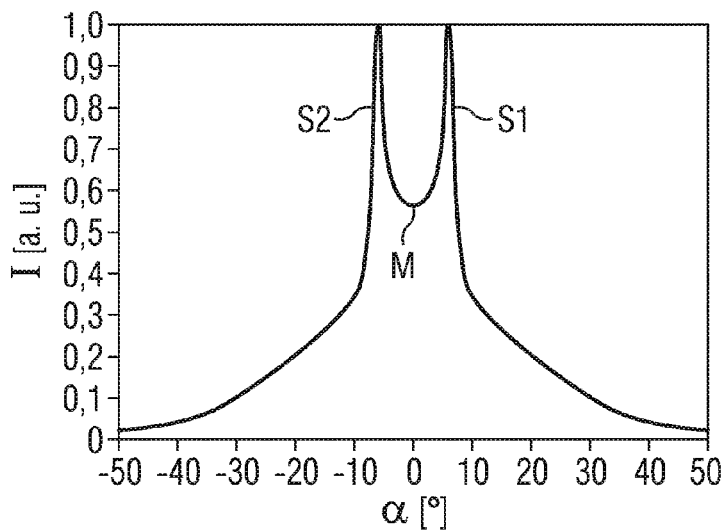

In the case of the laser diode according to FIG. 15, the n-cladding layer 6n exhibits a thickness of around 300 nm. This thickness of the n-cladding layer 6n is so low that an evanescent field extends into the carrier 2 and there leads to the formation of parasitic modes S1, S2 of a high intensity.

Figure 16:
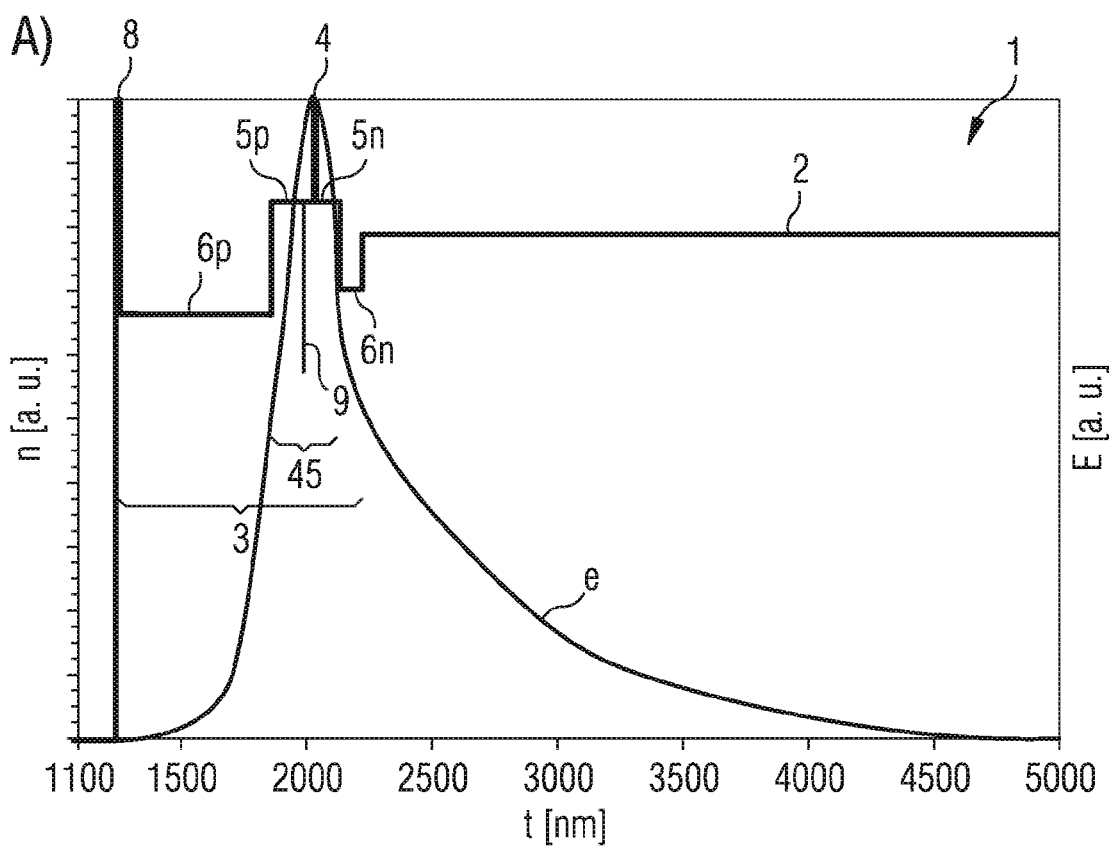
Figure 16:
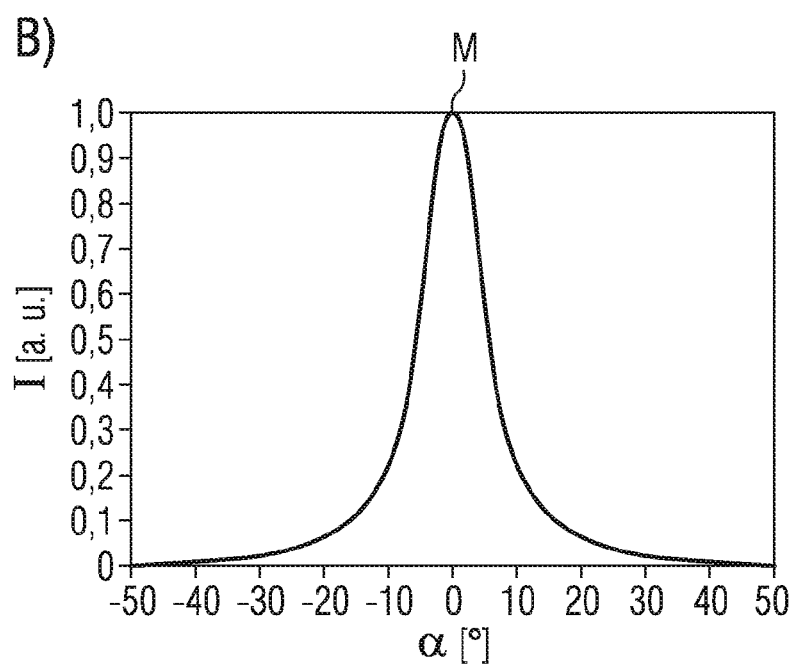

In contrast, in the exemplary embodiment according to FIG. 16 the thickness of the n-cladding layer 6n is reduced, such that the effective refractive index of the guided mode M is greater than the refractive index of the carrier 2, so preventing the occurrence of parasitic modes. The parasitic modes are thus eliminated not by increasing the thickness of the cladding layer, but rather by reducing its thickness.

The semiconductor chip 1 according to the exemplary embodiment of FIG. 16 is preferably an ultraviolet-emitting semiconductor laser chip. The carrier 2 is in particular a growth substrate, based on AN, AlGaN, AlInGaN or AlInN. Depending on the aluminium content, the stated materials for the carrier 2 have a lower refractive index than GaN. The waveguide 45 may therefore be based on GaN and/or comprise GaN barrier layers. If a wavelength of less than or equal to 365 nm is to be generated in the active zone 4, GaN-based quantum films with AlGaN-based waveguide layers 5n, 5p may also be used. If the carrier 2 is based on InGaN, AlInN or on AlInGaN, these materials having a higher refractive index than GaN, the waveguide 45 particularly preferably exhibits an even higher refractive index than the carrier 2.

In the exemplary embodiment according to FIG. 17A, in order to simplify the injection of charge carriers into the semiconductor layer sequence 3 and to reduce any voltage drop at the semiconductor layer sequence 3, the semiconductor layer sequence 3, beginning with the n-cladding layer 6n based on AlGaN, is grown directly on the carrier 2. The carrier 2 is in this case a highly doped substrate, preferably a GaN substrate. Highly doped means that a dopant concentration, for example of silicon or oxygen, amounts to between $1\times10^{18}$ per $cm^3$ and $1\times10^{20}$ per $cm^3$ inclusive. The cladding layers 6n, 6p and the waveguide layers 5n, 5p are furthermore shaped for example as in the exemplary embodiments according to FIG. 11 or FIG. 12.

According to FIG. 17B, a highly doped layer 7, preferably based on GaN, is additionally applied to the carrier 2, preferably based on GaN. A dopant concentration of the highly doped layer 7 is in the range between $1\times10^{18}$ per cm$^3$ and $1\times10^{20}$ per cm$^3$ inclusive or between $5\times10^{18}$ per cm$^3$ and $5\times10^{19}$ per cm$^3$ inclusive. Doping is effected for example with silicon or with oxygen. The thickness of the highly doped layer 7 is for example between 1 nm and 10 µm inclusive, preferably between 100 nm and 4 µm inclusive, particularly preferably between 0.5 µm and 2 µm inclusive.

To avoid additional optical absorption losses, in the exemplary embodiment according to FIG. 17C the highly doped layer 7 is not formed directly adjacent the n-cladding layer 6n. Between the n-cladding layer 6n and the highly doped layer 7 there is located an interlayer 67, which comprises for example a dopant concentration in the range between $5\times10^{17}$ per cm$^3$ and $5\times10^{18}$ per cm$^3$ inclusive. The thickness of the interlayer 67 is preferably between 500 nm and 2 µm inclusive.

Figure 18:
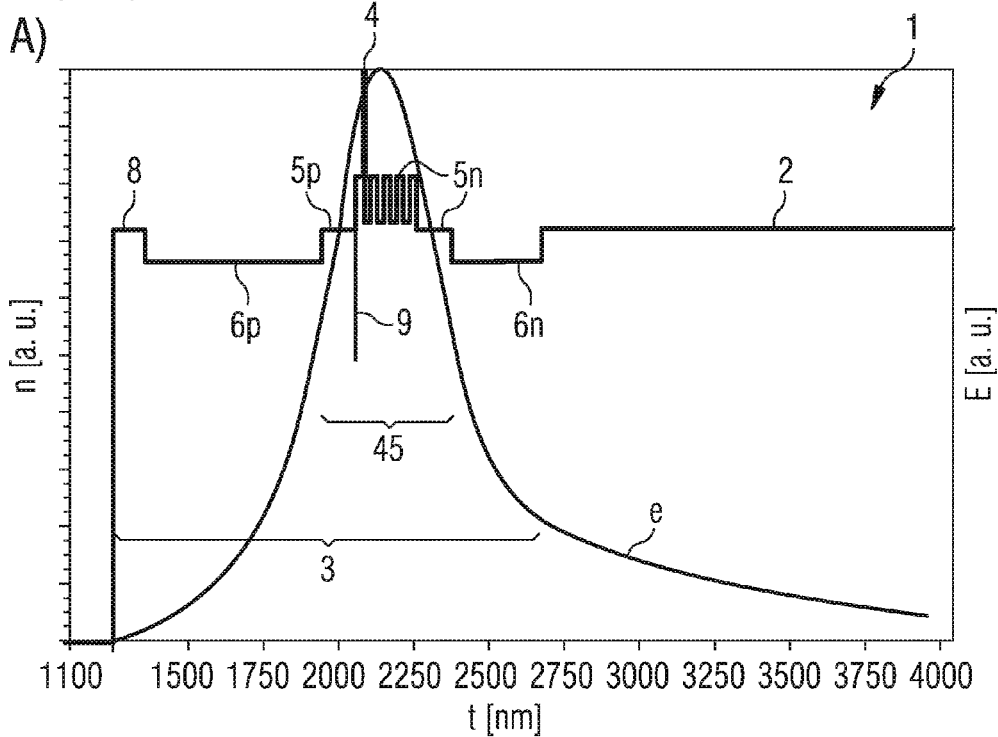
Figure 18:
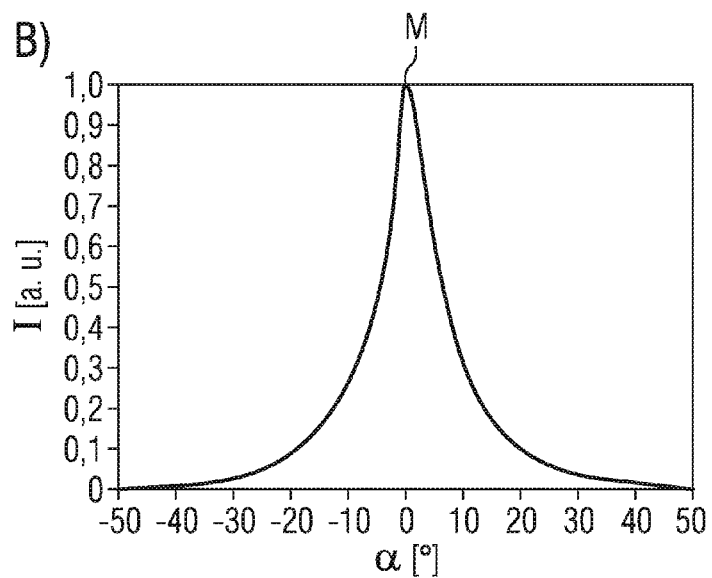
Figure 18:
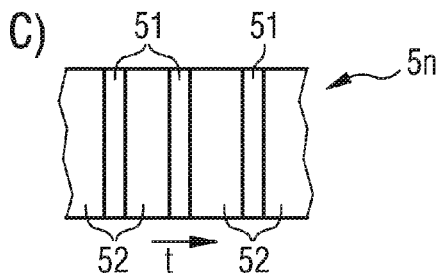

In the exemplary embodiment according to FIG. 18 the n-waveguide layer 5n comprises a superlattice. The superlattice is formed by first layers 51 and by second layers 52, which alternate with one another. The first layers 51 are based for example on InGaN with an indium content of between 0% and 10% inclusive, preferably between 0% and 5% inclusive. The thickness of the first layers 51 is between 0.1 nm and 50 nm inclusive, preferably between 1 nm and 5 nm inclusive. The second layers 52 are likewise based on InGaN with an indium content of between 1% and 25% inclusive, preferably between 3% and 10% inclusive. The thickness of the second layers 52 amounts in particular to between 0.1 nm and 50 nm inclusive, preferably between 1 nm and 20 nm inclusive. The thickness of the second layers 52 is here in each case greater than the thickness of the first layers 51 and the indium content of the first layers 51 is less than the indium content of the second layers 52, see also the schematic sectional representation in FIG. 18C.

Figure 19:
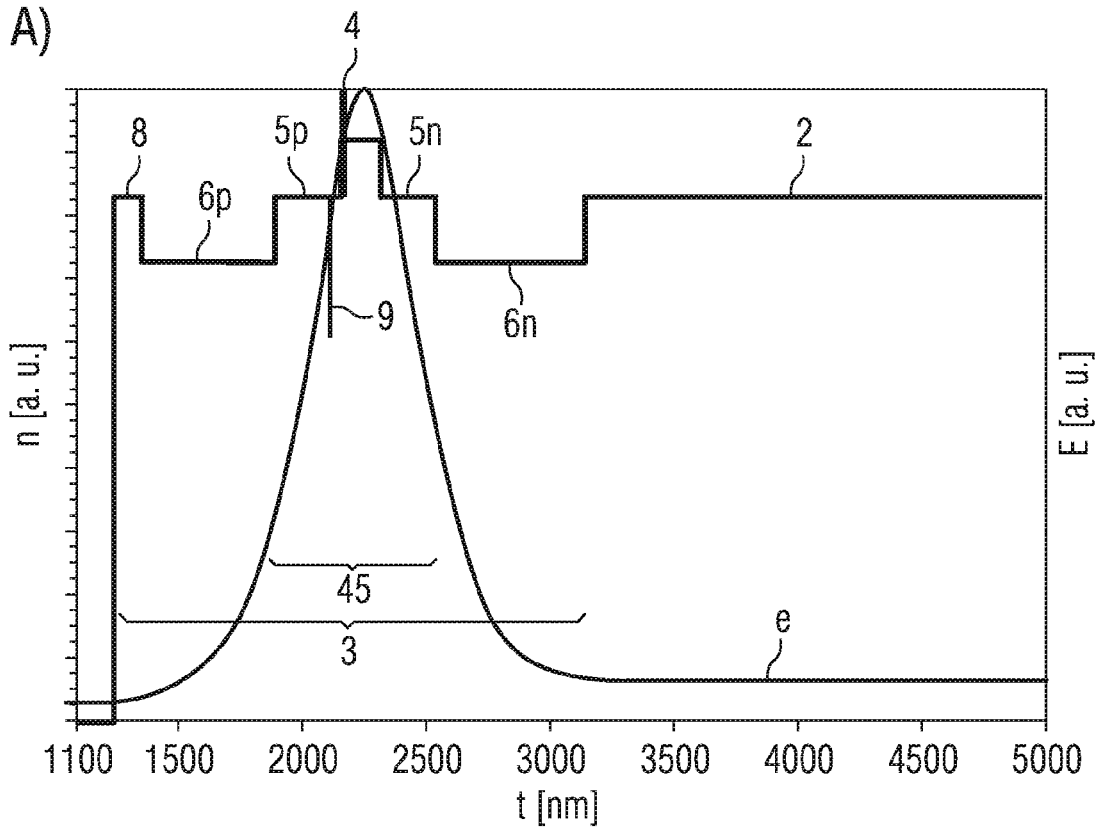
Figure 19:
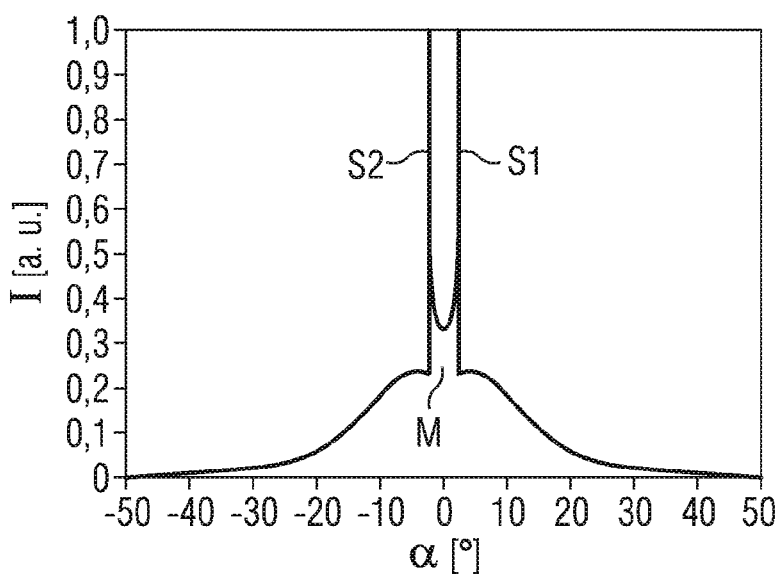
Figure 20:
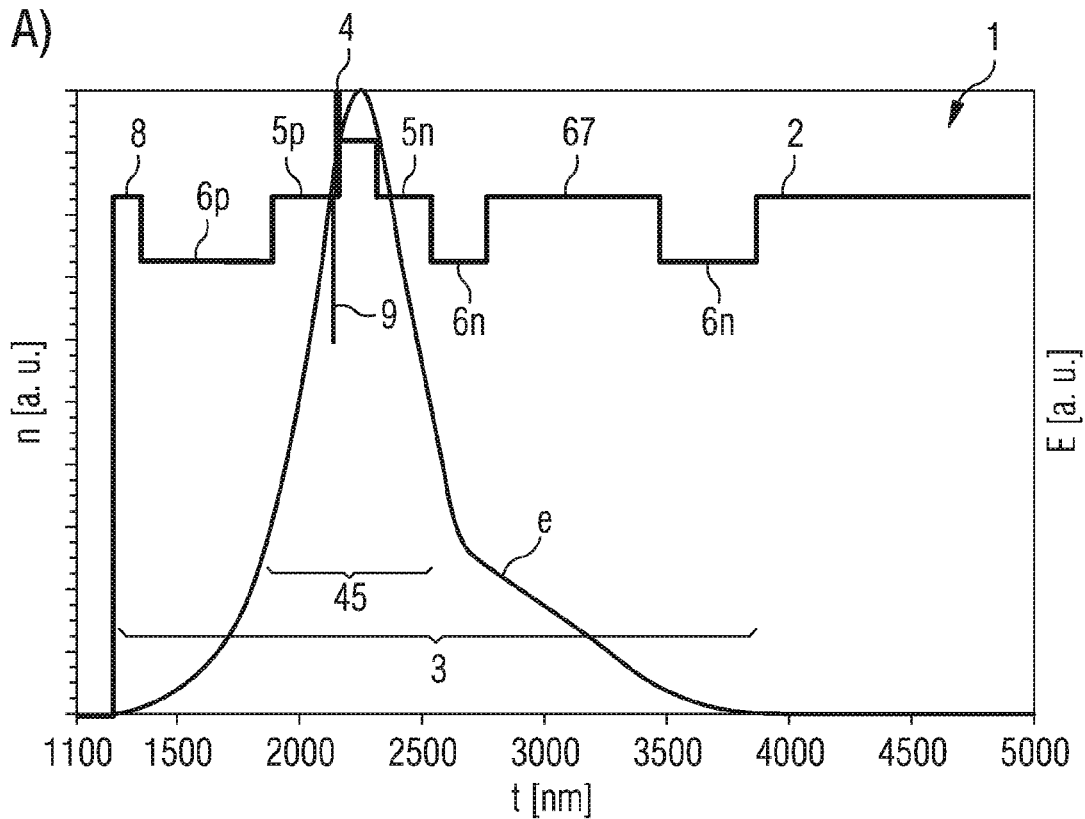
Figure 20:
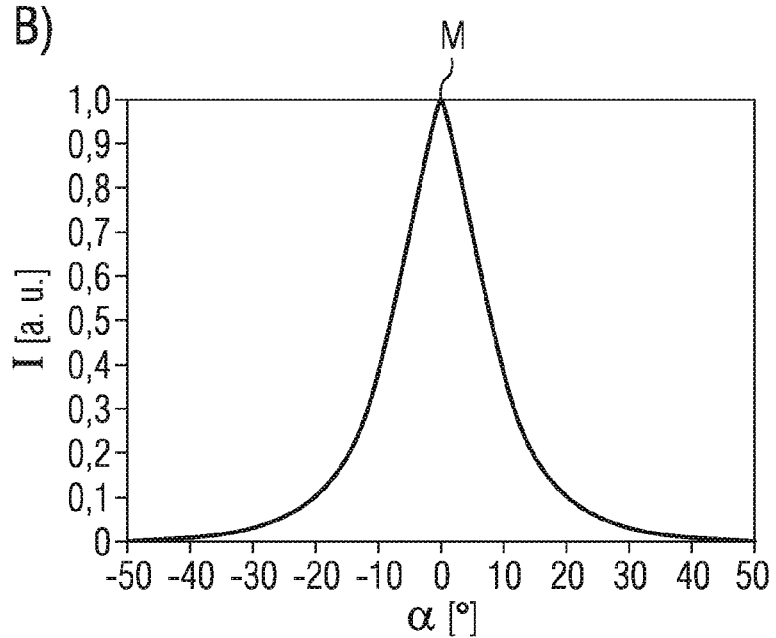

A carrier mode S1, S2 forms in the conventional laser diode according to FIG. 19. In contrast, the carrier mode S1, S2 is not present in the exemplary embodiment of the semiconductor chip 1 according to FIG. 20. This is achieved by subdividing the n-cladding layer 6n into a plurality of sub-layers. The sub-layers are separated from one another by the interlayer 67, which is based in particular on GaN and has a refractive index which approximately corresponds to that of the carrier 2.

For example, the sub-layer which is further away from the active zone 4 is of a greater thickness than the sub-layer located closer to the active zone 4. The thicknesses of the sub-layers are in particular between 100 nm and 600 nm inclusive. The interlayer 67 is preferably thicker than one or all of the sub-layers of the n-cladding layer 6n. The thickness of the interlayer 67 amounts in particular to between 200 nm and 1000 nm inclusive. An n-cladding layer 6n subdivided in this way into at least two sub-layers may also be used in the other exemplary embodiments of the semiconductor chip 1.

Figure 21:
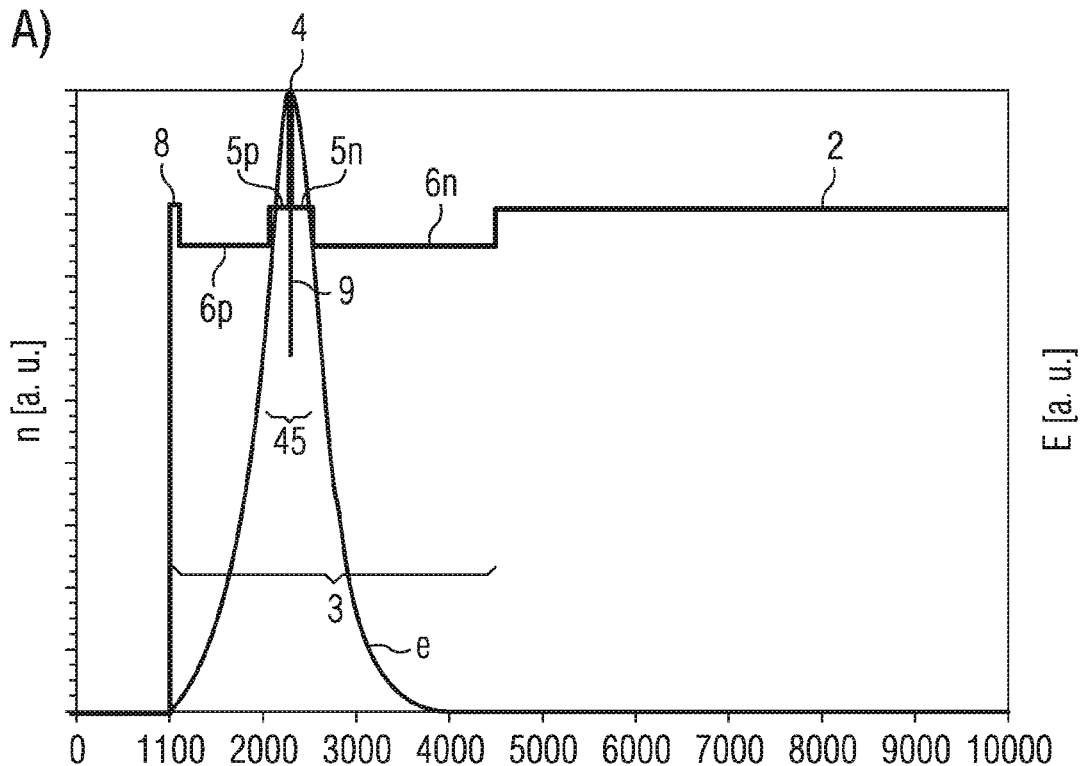
Figure 21:
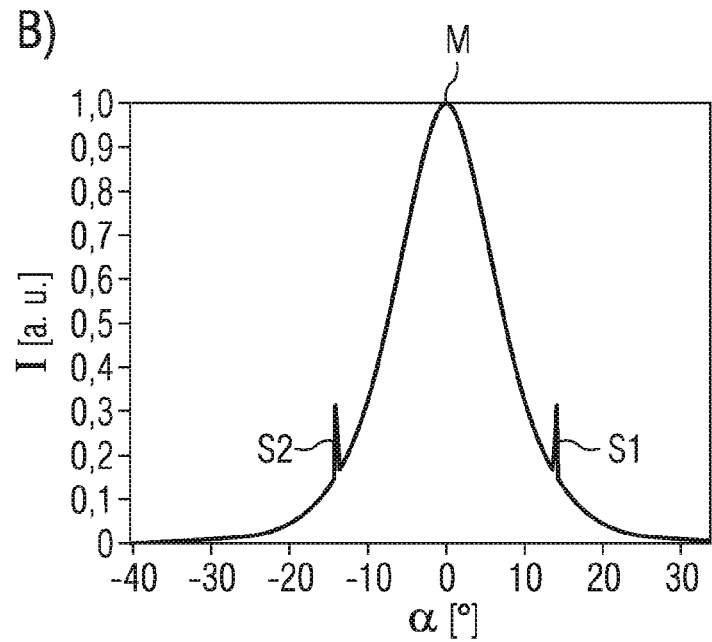

The laser diode according to FIG. 21 comprises two substrate modes S1, S2 which are small compared with the mode M guided in the waveguide 45, since the effective refractive index for the guided mode M is lower than the refractive index of the carrier 2. By modifying the n-cladding layer 6n, for example, as indicated in particular in one of the above-cited exemplary embodiments, and as a result of the associated increase in the effective refractive index for the guided mode M, the substrate modes S1, S2 may be suppressed. The multilayer structure of the laser diode according to FIG. 21 may therefore be used analogously for the cited exemplary embodiments.

The multilayer structure of the laser diode according to FIG. 21 is as follows, starting from the carrier 2 towards the contact layer 8:

The carrier 2 consists of in particular doped GaN and has a thickness of around 100 µm and a refractive index of 2.489. The refractive index details in each case relate, as indeed in the exemplary embodiments, to a wavelength of maximum intensity, for the emission of which the laser diode or the semiconductor chip 1 is designed.

The n-cladding layer 6n exhibits a thickness of around 2000 nm and has a refractive index of 2.447. A material of the n-cladding layer 6n is AlGaN with an Al-content of 5%.

The n-waveguide layer 5n is formed from GaN, has a refractive index of 2.469 and a thickness of around 200 nm.

The active zone 4 comprises three quantum films, which each have a thickness of around 3 nm, are formed with InGaN with an In content of around 17% and have a refractive index of 2.527. A barrier layer of GaN with thicknesses of around 8 nm and around 10 nm and a refractive index of 2.469 is in each case located between two adjacent quantum films.

An interlayer with GaN exhibiting a thickness of around 10 nm and a refractive index of 2.469 is located between the active zone 4 and the electron barrier layer 9. The electron barrier layer 9 has a thickness of around 10 nm, a refractive index of 2.385 and is based on AlGaN with an Al content of 20%.

The p-waveguide layer 5p exhibits a thickness of around 200 nm, a refractive index of 2.469 and is based on GaN.

The p-cladding layer 6p, based on AlGaN with an Al content of 5%, has a thickness of around 1000 nm and a refractive index of 2.447.

The contact layer 8 is based on GaN, has a thickness of around 50 nm and a refractive index of 2.469.

An effective refractive index for the guided mode M amounts for this multilayer structure to 2.457.

According to FIG. 21, the waveguide 45 is one-dimensional, whereas in the case of the laser diode according to FIG. 22 the waveguide is two-dimensional. The multilayer structure corresponds to that of FIG. 21. The contact layer 8 and the p-cladding layer 6p have been removed in places by etching, thereby forming a strip 13, or ridge, of a width of around 2 µm, the strip 13 being covered by a metal contact 11 remote from the carrier 2. Etching thus proceeds to a depth of the semiconductor layer sequence 3 of around 1050 nm. The etched regions are filled in to the sides of the strip 13 with a material 12 of a lower refractive index than the p-cladding layer 6p, for example with silicon dioxide with a refractive index of roughly 1.5 and a thickness of around 1000 nm. This reduces the effective refractive index for the guided mode M to 2.455, compared with a value of 2.457 according to FIG. 21. A half width of the mode M, see FIGS. 21B and 22B, is reduced by a factor of approx. 2 to roughly 8.8°.

Such a two-dimensional waveguide 45, as shown in FIG. 22A, may also be used in particular for all the exemplary embodiments of the semiconductor chip 1.

Figure 23:
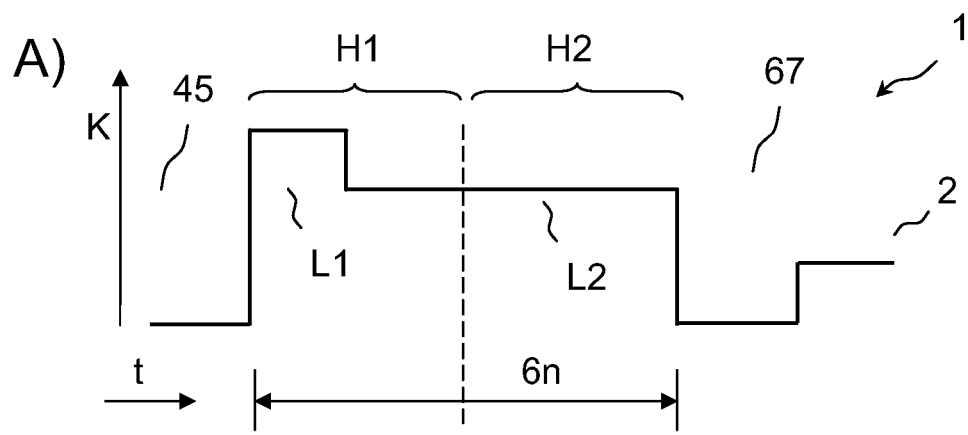
Figure 23:
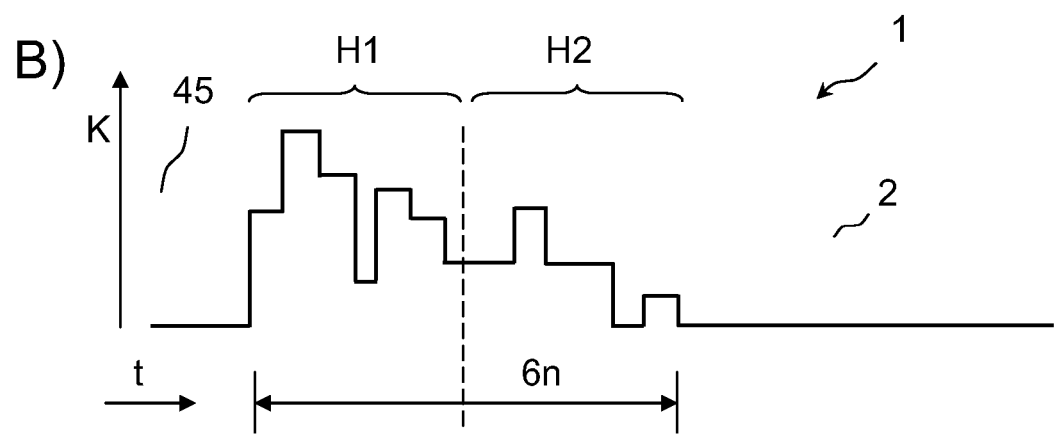
Figure 23:
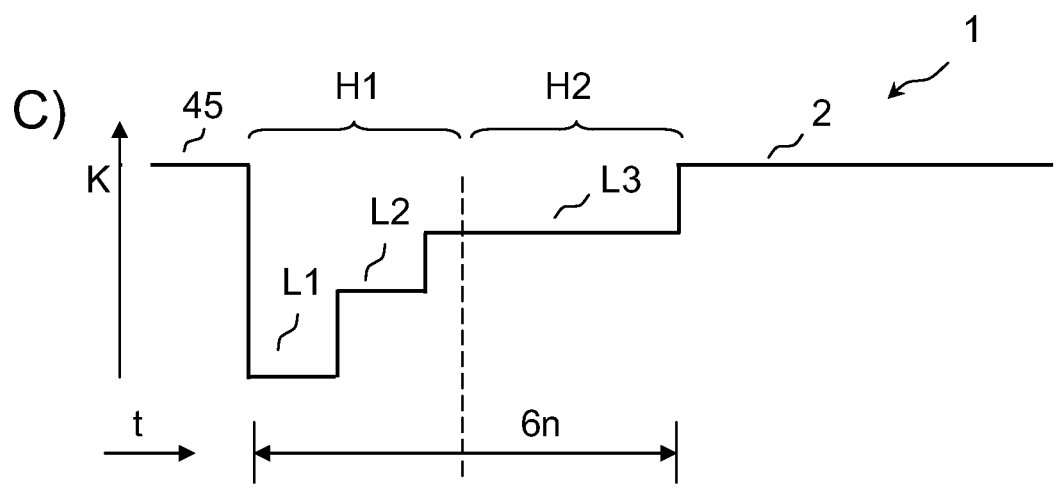

FIG. 23 shows portions of the semiconductor layer sequence 3 of further exemplary embodiments of the semiconductor chip 1 with the aid of a profile of the aluminium content K or of the refractive index n over the depth t. The cladding layer 6n is in each case divided into two notional halves H1, H2 of identical thickness, the first half H1 being closer to the waveguide 45 than the second half H2. The average aluminium content of the first half H1 exceeds the average aluminium content of the second half H2.

According to FIG. 23A, the n-cladding layer 6n comprises precisely two steps L1, L2 in the aluminium content. Within the steps L1, L2, the aluminium content is approximately constant. FIG. 23B shows an n-cladding layer 6n, which comprises a total of eleven steps. The n-cladding layer 6n comprises sub-layers which are adjoined on both sides by other sub-layers in each case having a higher aluminium content. FIG. 23C shows the profile of the refractive index over the depth t. In the first half H1, the average refractive index is less than in the second half H2. The n-cladding layer 6n comprises three steps L1, L2, L3.

Unlike in FIG. 23, it is alternatively or additionally possible for the p-cladding layer also to be formed in this way.

FIG. 24 describes variants of exemplary embodiments of the semiconductor chip 1 by means of a Table and with regard to cladding layers 6n, 6p. For all the variants, the average aluminium content Ka(H1) of the first half H1 is greater than the average aluminium content Ka(H2) of the second half H2. Variants 1 to 8 comprise a stepped profile of the aluminium content K, the average aluminium content K(L1, L2, L3, L4) of the steps L1, L2, L3, L4 and the thicknesses d(L1, L2, L3, L4) thereof being indicated. According to variants 9 and 10, the aluminium content K firstly proceeds in the form of a ramp and then in the form of the step L2. In variant 9, the aluminium content K decreases in linear manner in the ramp, starting from the waveguide 45, while in variant 10 it increases in linear manner.

The values listed in the table may be produced in exemplary embodiments of the semiconductor chip 1 in each case with a tolerance of at most 25% or of at most 10%, providing that the average aluminium content Ka(H1) of the first half H1 is greater than that of the second half H2. For example a tolerance of at most 25% for a thickness of 400 nm indicated in the Table means that a thickness range of 400 nm±25% is described, i.e., of 300 nm to 500 nm inclusive.

The invention described herein is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic semiconductor chip comprising:
a carrier; and
a semiconductor layer sequence mounted on the carrier, the semiconductor layer sequence based on a nitride compound semiconductor material and comprising:
an active zone configured to generate electromagnetic radiation,
a waveguide layer adjoining the active zone, a waveguide being formed by the waveguide layer and the active zone, and
a cladding layer comprising a p-cladding layer adjoining the waveguide layer on a p-doped side and/or an n-cladding layer on an n-doped side of the active zone,
wherein an effective refractive index in the waveguide is greater than a refractive index of the carrier,
wherein an evanescent field of the radiation totally reflected at the p-cladding layer or at the n-cladding layer and generated in the active zone extends as far as into the carrier, and
wherein an amplitude of the evanescent field in the carrier, relative to an output amplitude at a totally reflecting boundary surface, amounts in places to at least 2.5%.

2. The optoelectronic semiconductor chip according to claim 1,
wherein the p-cladding layer is subdivided into at least two sub-layers with mutually different average aluminum contents, and
wherein a first half of the p-cladding layer has a higher average aluminum content than a second half of the p-cladding layer, the first and second halves being of identical thickness and the first half being closer to the waveguide.

3. The optoelectronic semiconductor chip according to claim 1, wherein the effective refractive index is at most 1.05 times the refractive index of the carrier.

4. The optoelectronic semiconductor chip according to claim 1, wherein a function describing a profile of an electrical field falls monotonically, from the active zone in a direction perpendicular to and towards the carrier.

5. The optoelectronic semiconductor chip according to claim 1, wherein the n-cladding layer has a thickness between 0.1 nm and 2000 nm inclusive and/or the p-cladding layer has a thickness between 10 nm and 1500 nm inclusive.

6. The optoelectronic semiconductor chip according to claim 1, wherein the cladding layer includes a layer based on one of the following materials:
$Al_xGa_{1-x}N$ with $0.0001 \leq x \leq 0.30$,
$Al_xIn_{1-x}N$ with $0.74 \leq x \leq 0.90$, or
$(Al_{1-y}In_y)_xGa_{1-x}N$ with $0.74 \leq y \leq 0.90$ and $0.01 \leq x \leq 0.3$.

7. The optoelectronic semiconductor chip according to claim 1, wherein the cladding layer includes a layer based on one of the following materials:
$Al_xGa_{1-x}N$ with $0.0001 \leq x \leq 0.30$,
$Al_xIn_{1-x}N$ with $0.74 \leq x \leq 0.90$, or
$(Al_{1-y}In_y)_xGa_{1-x}N$ with $0.74 \leq y \leq 0.90$ and $0.01 \leq x \leq 0.3$ and/or in which the n-cladding layer takes the form of a hole barrier.

8. The optoelectronic semiconductor chip according to claim 1, wherein the at least one cladding layer comprises the n-cladding layer, the n-cladding layer and/or the waveguide layer comprising a superlattice with layers with alternately high and low refractive indices and in each case thicknesses of between 0.1 nm and 70 nm inclusive.

9. The optoelectronic semiconductor chip according to claim 8,
wherein the superlattice alternately comprises first layers, based on $In_{x1}Ga_{1-x}1N$ with $0 \leq x1 \leq 0.10$, and second layers, based on $In_{x}2Ga_{1-x}2N$ with $0.01 \leq x2 \leq 0.25$, and
wherein the superlattice is formed in the waveguide layer.

10. The optoelectronic semiconductor chip according to claim 1, wherein the at least one cladding layer comprises the p-cladding layer, the p-cladding layer comprising a superlattice with layers with alternately high and low refractive indices and in each case thicknesses of between 1 nm and 70 nm inclusive.

11. The optoelectronic semiconductor chip according to claim 1, further comprising a highly doped layer between the carrier and the cladding layer closest to the carrier, the highly doped layer having a doping concentration between $1 \times 10^{18}$ per $cm^3$ and $1 \times 10^{20}$ per $cm^3$ inclusive and a thickness between 1 nm and 10 μm inclusive.

12. The optoelectronic semiconductor chip according to claim 1, wherein in which the waveguide layer and/or the cladding layer exhibit a stepped refractive index profile.

13. The optoelectronic semiconductor chip according to claim 1, further comprising a strip formed by partial removal of the p-cladding layer, the strip being surrounded laterally at least in part by a material with a relatively low refractive index.

14. The optoelectronic semiconductor chip according to claim 1, wherein the at least one cladding layer includes an n-cladding layer in the form of a hole barrier.

15. The optoelectronic semiconductor chip according to claim 1, wherein the carrier has a dopant concentration between $1\times10^{18}$ per $cm^3$ and $1\times10^{20}$ per $cm^3$.

* * * * *

UNITED STATES PATENT AND TRADEMARK OFFICE
CERTIFICATE OF CORRECTION

PATENT NO. : 8,916,849 B2
APPLICATION NO. : 13/579259
DATED : December 23, 2014
INVENTOR(S) : Christoph Eichler It is certified that error appears in the above-identified patent and that said Letters Patent is hereby corrected as shown below:

In the Claims

In Col. 14, line 48, claim 9 delete "$In_xGa_{1-x}1N$" and insert --$In_{x1}Ga_{1-x1}N$--.
In Col. 14, line 49, claim 9 delete "$In_x2Ga_{1-x}2N$" and insert --$In_{x2}Ga_{1-x2}N$--.
In Col. 14, line 64, claim 12 delete "claim 1, wherein in which the" and insert --claim 1, in which the--.

Signed and Sealed this
Fifth Day of May, 2015

Michelle K. Lee
*Director of the United States Patent and Trademark Office*